United States Patent
Yoshitake et al.

(10) Patent No.: US 7,582,364 B2
(45) Date of Patent: Sep. 1, 2009

(54) ORGANIC ELECTROLUMINESCENT DEVICE

(75) Inventors: Osamu Yoshitake, Kitakyushu (JP); Hiroshi Miyazaki, Kitakyushu (JP); Daisuke Suzaki, Niigata (JP); Yu Yamada, Tokyo (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 317 days.

(21) Appl. No.: 10/573,786

(22) PCT Filed: Sep. 21, 2004

(86) PCT No.: PCT/JP2004/013752

§ 371 (c)(1),
(2), (4) Date: Jun. 28, 2006

(87) PCT Pub. No.: WO2005/030901

PCT Pub. Date: Apr. 7, 2005

(65) Prior Publication Data

US 2007/0012935 A1     Jan. 18, 2007

(30) Foreign Application Priority Data

Sep. 29, 2003    (JP) .............................. 2003-338081

(51) Int. Cl.
*H01L 51/54* (2006.01)
(52) U.S. Cl. ................... 428/690; 428/917; 313/504; 313/506; 257/E51.041; 257/E51.044; 257/E51.05
(58) Field of Classification Search ....................... None
See application file for complete search history.

(56) References Cited

U.S. PATENT DOCUMENTS

| 2002/0028329 A1 | 3/2002 | Ise et al. |
| 2002/0117662 A1 | 8/2002 | Nii |
| 2003/0146443 A1 | 8/2003 | Yamazaki et al. |

FOREIGN PATENT DOCUMENTS

| JP | 2001-230079 A | 8/2001 |
| JP | 2002-100476 A | 4/2002 |
| JP | 2002-305084 A | 10/2002 |
| JP | 2003-109767 A | 4/2003 |
| JP | 2003-229275 A | 8/2003 |
| JP | 2004-146368 A | 5/2004 |

OTHER PUBLICATIONS

Machine translation of JP 2004-146368 (May 2004).*

* cited by examiner

*Primary Examiner*—Marie R. Yamnitzky
(74) *Attorney, Agent, or Firm*—Birch, Stewart, Kolasch & Birch, LLP

(57) ABSTRACT

This invention provides an organic electroluminescent element (organic EL element) utilizing phosphorescence which emits light efficiently with high luminance at low current density, shows good driving stability and is applicable to display devices such as flat panel displays and illuminating devices. The element comprises an anode, organic layers and a cathode piled one upon another on a substrate, at least one of the organic layers is a light-emitting layer containing a host material and a dopant material and a pyrazole-derived compound having 2-4 pyrazole structures represented by the following formula I in the same molecule is used as said host material;

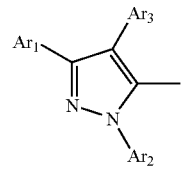

(I)

wherein, $Ar_1$-$Ar_3$ are independently hydrogen or substituted or unsubstituted aromatic hydrocarbon groups and at least one of $Ar_1$-$Ar_3$ is a group other than hydrogen.

6 Claims, 1 Drawing Sheet

ORGANIC ELECTROLUMINESCENT DEVICE

FIELD OF TECHNOLOGY

This invention relates to an organic electroluminescent element and, more particularly, to a thin-film device which emits light when an electrical field is applied to its organic light-emitting layer.

BACKGROUND TECHNOLOGY

In the development of electroluminescent elements utilizing organic materials (hereinafter referred to as organic EL element), the kind of electrodes was optimized for the purpose of improving the electron-injecting efficiency from the electrode and an element in which a hole-transporting layer of an aromatic diamine and a light-emitting layer of 8-hydroxyquinoline aluminum complex are disposed as thin films between the electrodes has been developed (Appl. Phys. Lett., Vol. 51, p. 913, 1987) to bring about a noticeable improvement in luminous efficiency over the conventional elements utilizing single crystals of anthracene and the like. Following this, the developmental works of organic EL elements have been focused on their commercial applications to high-performance flat panels characterized by self luminescence and high-speed response.

In order to improve the efficiency of such organic EL elements still further, various modifications of the aforementioned basic structure of anode/hole-transporting layer/light-emitting layer/cathode have been tried by suitably adding a hole-injecting layer, an electron-injecting layer and an electron-transporting layer. For example, the following structures are known: anode/hole-injecting layer/hole-transporting layer/light-emitting layer/cathode; anode/hole-injecting layer/light-emitting layer/electron-transporting layer/cathode; and anode/hole-injecting layer/light-emitting layer/electron-transporting layer/electron-injecting layer/cathode. The hole-transporting layer has a function of transporting the holes injected from the hole-injecting layer to the light-emitting layer while the electron-transporting layer has a function of transporting the electrons injected from the cathode to the light-emitting layer.

A large number of organic materials conforming to the function of these layered structures have been developed.

The aforementioned element comprising the hole-transporting layer of an aromatic diamine and the light-emitting layer of 8-hydroxyquinoline aluminum complex and many other elements utilize fluorescence. Now, the utilization of phosphorescence, that is, emission of light from the triplet excited state, is expected to enhance the luminous efficiency approximately three times that of the conventional elements utilizing fluorescence (singlet). To achieve this object, studies have been conducted on the use of coumarin derivatives and benzophenone derivatives in the light-emitting layer, but the result was nothing but extremely low luminance. Thereafter, the use of europium complexes was attempted, but it was unable to obtain high luminous efficiency.

The prior technical documents relating to this invention are listed below.

Patent literature 1: JP2002-352957 A
Patent literature 2: JP2001-230079 A
Patent literature 3: JP2001-313178 A
Patent literature 4: JP2003-45611 A
Patent literature 5: JP2002-158091 A Non-patent literature 1: Nature, Vol. 395, p. 151, 1998
Non-patent literature 2: Appl. Phys. Lett., Vol. 75, p. 4, 1999

The possibility of emitting red light at high efficiency by the use of a platinum complex (PtOEP) is reported in the aforementioned non-patent literature 1. Thereafter, it is reported in non-patent literature 2 that the efficiency of emitting green light has been improved markedly by doping the light-emitting layer with iridium complexes (Ir(ppy)3). It is reported further that optimization of the light-emitting layer enables these iridium complexes to show extremely high luminous efficiency even when the structure of an element is simplified.

In applying organic EL elements to display devices such as flat panel displays, it is necessary to improve the luminous efficiency and at the same time to secure the driving stability. The organic EL elements utilizing phosphorescent molecules of Ir(ppy)3 described in non-patent literature 2, although highly efficient, are not suitable for practical use because of their insufficient driving stability at the present time (Jpn. J. Appl. Phys., Vol. 38, L1502, 1999).

The main cause of the deterioration of the aforementioned driving stability is presumed to be the deterioration of the shape of thin film of the light-emitting layer in the structure of an element such as substrate/anode/hole-transporting layer/light-emitting layer/hole-blocking layer/electron-transporting layer/cathode or substrate/anode/hole-transporting layer/light-emitting layer/electron-transporting layer/anode. It is likely that the deterioration of the shape of thin film is attributable to crystallization (or cohesion) of thin organic amorphous films caused by generation of heat during driving of the element and poor heat resistance is due to low glass transition temperature (Tg) of the material in use.

It is described in non-patent literature 2 that a carbazole compound (CBP) or a triazole compound (TAZ) is used in the light-emitting layer and a phenanthroline derivative (HB-1) is used in the hole-blocking layer. Because of their high symmetry and low molecular weight, these compounds readily undergo crystallization or cohesion and suffer deterioration of the shape of thin film. Besides, their crystallizability is too high to allow observation of their Tg. Such instability of the shape of thin film of the light-emitting layer adversely affects the performance of an element, for example, by shortening the driving life and lowering the heat resistance. For the reasons described above, a difficult problem facing phosphorescent organic electroluminescent elements at the present time is their driving stability.

It is disclosed in the aforementioned patent literature 1 that a compound containing an oxadiazolyl group is used as a host material in an organic EL element comprising a host material and a phosphorescent dopant material in its light-emitting layer. An organic EL element comprising a thiazole or pyrazole structure in its organic layers is disclosed in patent literature 2. An organic EL element comprising a phosphorescent iridium complex and a carbazole compound in its light-emitting layer is disclosed in patent literature 3. An organic EL element comprising a carbazole compound (PVK), a compound containing an oxadiazolyl group (PBD) and an iridium complex (Ir(ppy)3) in its light-emitting layer is disclosed in patent literature 4. Ortho-metalated metal complexes and porphyrin metal complexes are proposed as phosphorescent compounds in patent literature 5. However, they face the aforementioned problem. It is to be noted that patent literature 2 discloses no organic EL elements utilizing phosphorescence.

DISCLOSURE OF THE INVENTION

Problems to be Solved by the Invention

Improvement of the driving stability and heat resistance of organic EL elements is an essential requirement when their applications to display devices such as flat panel displays and illuminating devices are considered. In view of the aforementioned present conditions, an object of this invention is to provide an organic EL element which performs with high efficiency and high driving stability.

Means to Solve the Problems

This invention relates to an organic electroluminescent element comprising an anode, organic layers and a cathode piled one upon another on a substrate; at least one of the organic layers is a light-emitting layer containing a host material and a dopant material and a pyrazole-derived compound containing 2-4 pyrazole structures represented by the following formula I in the same molecule is used as said host material.

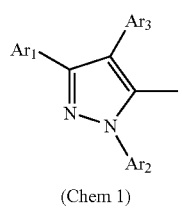

(Chem 1)

A compound represented by the following formula II is preferable as such a pyrazole-derived compound.

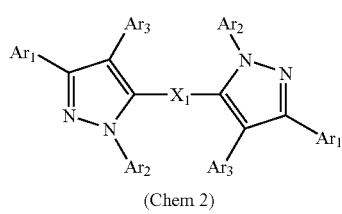

(Chem 2)

In formulas I and II, $Ar_1$-$Ar_3$ are independently hydrogen or substituted or unsubstituted aromatic hydrocarbon groups and $X_1$ is a direct bond or a substituted or unsubstituted divalent aromatic hydrocarbon group.

A dopant material preferably contains at least one metal complex selected from phosphorescent ortho-metalated metal complexes and porphyrin metal complexes. Organic metal complexes containing at least one metal selected from groups 7-11 of the periodic table as their central metal are also preferable. Preferred examples of this metal are ruthenium, rhodium, palladium, silver, rhenium, osmium, iridium, platinum and gold.

An organic electroluminescent element of this invention advantageously comprises a hole-blocking layer between a light-emitting layer and a cathod or an electron-transporting layer between a light-emitting layer and a cathode.

An organic electroluminescent element (organic EL element) of this invention has at least one organic layer which is a light-emitting layer and this light-emitting layer contains a specified host material and a specified phosphorescent dopant material, with the host material constituting the primary component and the dopant material the secondary component.

The primary component here means the component which accounts for 50 wt % or more of the materials constituting the layer in question while the secondary component means the rest of the materials. A host material has an excited triplet level higher in energy than that of a dopant material.

According to this invention, a compound to be incorporated in the light-emitting layer as a host material is required to form a thin film of stable shape, have a high glass transition temperature (Tg) and transport holes and/or electrons efficiently. Further, the compound is required to be electrochemically and chemically stable and rarely generate impurities during manufacture or use which become traps or quench emitted light. As a compound satisfying these requirements, a pyrazole-derived compound having a pyrazole structure represented by the aforementioned formula I is used.

In formula I, $Ar_1$-$Ar_3$ are independently hydrogen or substituted or unsubstituted aromatic hydrocarbon groups and at least one of $Ar_1$-$Ar_3$ is an aromatic hydrocarbon group.

One of the requirements a host material must satisfy in order to form a thin film of stable shape is an adequate molecular weight and the presence of 2 or more pyrazole structures is desirable to satisfy this requirement. A host material is usually made into film by vacuum deposition and an organic compound having a larger molecular weight than is necessary requires excessive energy in vacuum deposition and decomposition occurs in preference to evaporation. For this reason, the number of pyrazole structures is preferably 4 or so, more preferably 2.

Preferable pyrazole-derived compounds are those represented by the aforementioned formula II wherein $Ar_1$-$Ar_3$ are as defined in formula I.

In formulas I and II, $Ar_1$-$Ar_3$ are preferably hydrogen or aromatic hydrocarbon groups of 1-3 rings and they may have substituents. The number of such substitutents is preferably in the range of 0-3. The aromatic hydrocarbon groups include aryl groups of 1-3 rings such as phenyl, naphthyl and anthracenyl groups. These groups may have substituents; for example, lower alkyl groups of 1-6 carbon atoms such as methyl and ethyl and aryl groups of 6-12 carbon atoms such as phenyl and methylphenyl. Alkyl groups of 1-3 carbon atoms are more preferable as substituents.

Advantageously, $Ar_2$ is an aromatic hydrocarbon group and one or both of $Ar_1$ and $Ar_3$ are aromatic hydrocarbon groups. More preferably, $Ar_1$ and $Ar_2$ are aromatic hydrocarbon groups and $Ar_3$ is hydrogen or an aromatic hydrocarbon group. Preferred hydrocarbon groups are phenyl, naphthyl, methylphenyl, methylnaphthyl and phenylphenyl groups. A compound represented by formula II wherein $Ar_1$ and $Ar_2$ are phenyl groups, $Ar_3$ is hydrogen or phenyl group and $X_1$ is phenylene group is cited as an example of preferred compounds.

Concretely, preferred hydrocarbon groups include the following; phenyl, 2-methylphenyl, 3-methylphenyl, 4-methylphenyl, 2,4-dimethylphenyl, 3,4-dimethylphenyl, 2,4,5-trimethylphenyl, 4-ethylphenyl, 4-tert-butylphenyl, 1-naphthyl, 2-naphthyl, 1-anthracenyl, 2-anthracenyl, 9-anthracenyl and 9-phenanthrenyl. The groups $Ar_1$-$Ar_3$ may be identical with or different from one another.

The group $X_1$ denotes a direct bond or a substituted or unsubstituted divalent aromatic hydrocarbon group, preferably a divalent aromatic hydrocarbon group of 1-3 rings; concrete examples are 1,4-phenylene, 1,3-phenylene, 1,4-naphthylene, 1,5-naphthylene, 2,6-naphthylene, 3,3'-biphenylene, 4,4'-biphenylene and 9,10-anthracenylene. Alkyl groups of 1-6 carbon atoms are cited for substituents. More preferably, $X_1$ is phenylene, naphthylene or biphenylene group.

An important requirement for forming a thin film of stable shape is suppression of crystallizability. The crystallizability of organic compounds is considered to be governed by symmetry of the molecular structure (planarity), intermolecular interaction of polar groups and the like. The pyrazole-derived compounds to be used in this invention are prevented from assuming a planar molecular structure by the presence of an aromatic group at the position 1, 3 or 4 of the pyrazole ring, that is, their crystallizability is suppressed. Furthermore, arranging bulky hydrocarbon groups around strongly polar nitrogen atoms produces an effect of suppressing also the intramolecular interaction.

Compounds represented by general formula II are listed in Tables 1-6, but they are not limited to these examples. The groups $X_1$ and $Ar_1$-$Ar_3$ in the tables correspond to those of general formula II.

TABLE 1

| No. | $X_1$ | $Ar_1$ | $Ar_2$ | $Ar_3$ |
|---|---|---|---|---|
| 101 | 1,4-phenylene | phenyl | phenyl | H |
| 102 | 1,4-phenylene | phenyl | 1-naphthyl | H |
| 103 | 1,4-phenylene | phenyl | 2-naphthyl | H |
| 104 | 1,4-phenylene | 1-naphthyl | phenyl | H |
| 105 | 1,4-phenylene | 1-naphthyl | 1-naphthyl | H |
| 106 | 1,4-phenylene | 1-naphthyl | 2-naphthyl | H |
| 107 | 1,4-phenylene | 2-naphthyl | phenyl | H |
| 108 | 1,4-phenylene | 2-naphthyl | 1-naphthyl | H |
| 109 | 1,4-phenylene | 2-naphthyl | 2-naphthyl | H |

TABLE 1-continued

| No. | X₁ | Ar₁ | Ar₂ | Ar₃ |
|---|---|---|---|---|
| 110 | 1,4-phenylene | phenyl | phenyl | phenyl |
| 111 | 1,4-phenylene | phenyl | 1-naphthyl | phenyl |

TABLE 2

| No. | X₁ | Ar₁ | Ar₂ | Ar₃ |
|---|---|---|---|---|
| 112 | 1,4-phenylene | phenyl | 2-naphthyl | phenyl |
| 113 | 1,4-phenylene | 1-naphthyl | phenyl | phenyl |
| 114 | 1,4-phenylene | 1-naphthyl | 1-naphthyl | phenyl |
| 115 | 1,4-phenylene | 1-naphthyl | 2-naphthyl | phenyl |
| 116 | 1,4-phenylene | 2-naphthyl | phenyl | phenyl |
| 117 | 1,4-phenylene | 2-naphthyl | 1-naphthyl | phenyl |
| 118 | 1,4-phenylene | 2-naphthyl | 2-naphthyl | phenyl |
| 119 | 4,4'-biphenylene | phenyl | phenyl | H |

TABLE 2-continued
| No. | X$_1$ | Ar$_1$ | Ar$_2$ | Ar$_3$ |
|---|---|---|---|---|
| 120 | 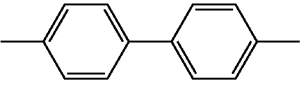 | 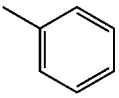 | 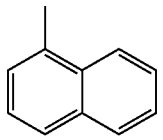 | H |
| 121 | 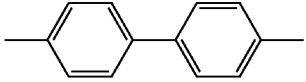 | 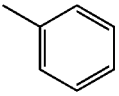 | 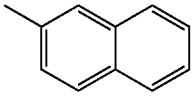 | H |
| 122 | 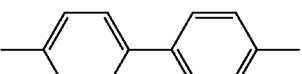 | 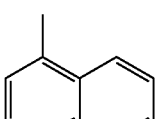 | 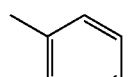 | H |
TABLE 3
| No. | X$_1$ | Ar$_1$ | Ar$_2$ | Ar$_3$ |
|---|---|---|---|---|
| 123 | 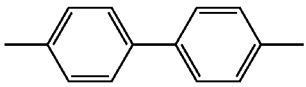 | 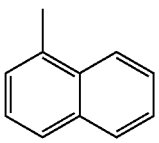 | 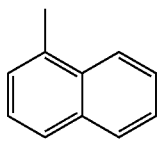 | H |
| 124 | 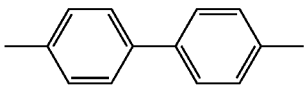 | 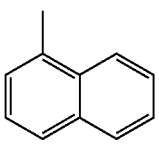 | 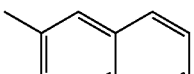 | H |
| 125 | 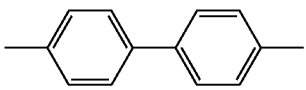 | 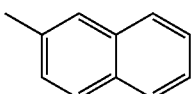 | 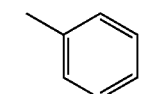 | H |
| 126 | 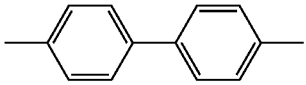 | 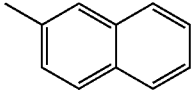 | 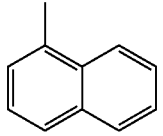 | H |
| 127 | 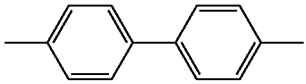 | 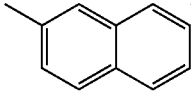 | 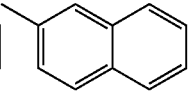 | H |
| 128 | 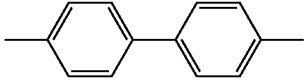 | 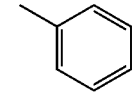 | 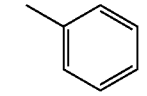 | 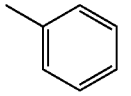 |
| 129 | 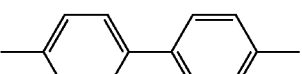 | 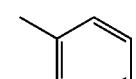 | 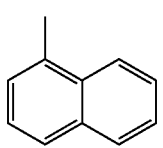 | 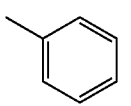 |

TABLE 3-continued
| No. | X₁ | Ar₁ | Ar₂ | Ar₃ |
|---|---|---|---|---|
| 130 | 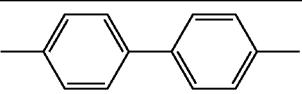 |  | 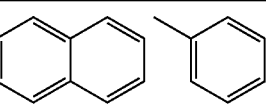 | 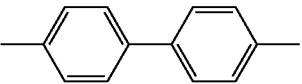 |
| 131 | 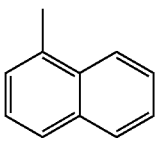 | 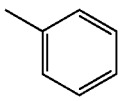 |  | 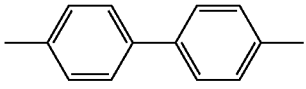 |
| 132 | 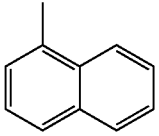 | 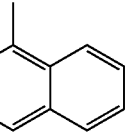 |  | 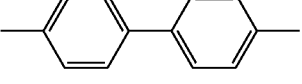 |
| 133 | 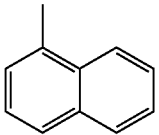 | 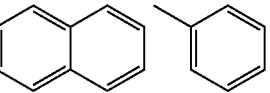 | 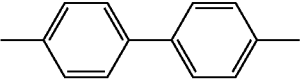 | 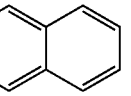 |
TABLE 4
| No. | X₁ | Ar₁ | Ar₂ | Ar₃ |
|---|---|---|---|---|
| 134 |  |  | 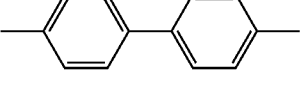 | 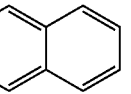 |
| 135 | 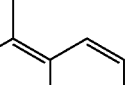 |  | 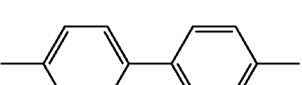 | 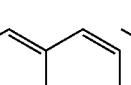 |
| 136 | 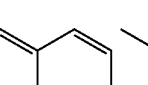 |  | 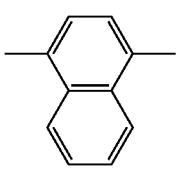 | 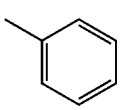 |
| 137 | 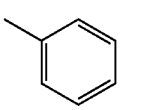 | 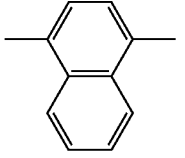 | 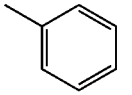 | H |
| 138 | 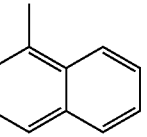 | 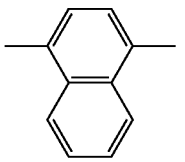 | 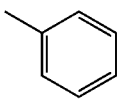 | H |
| 139 | 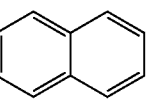 | | | H |

TABLE 4-continued
| No. | X₁ | Ar₁ | Ar₂ | Ar₃ |
|---|---|---|---|---|
| 140 | 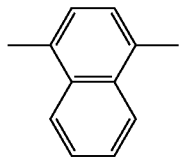 | 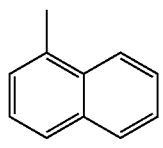 |  | H |
| 141 | 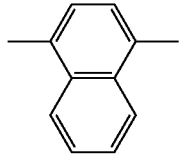 | 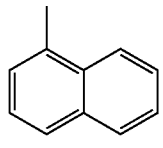 | 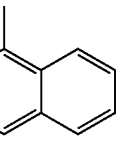 | H |
| 142 | 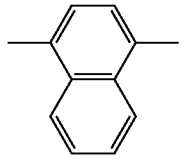 | 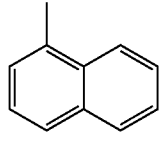 |  | H |
| 143 | 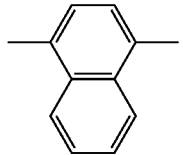 | 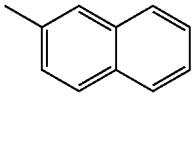 |  | H |
| 144 | 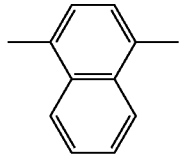 | 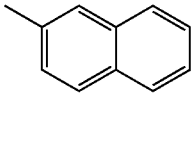 | 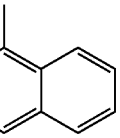 | H |
TABLE 5
| No. | X₁ | Ar₁ | Ar₂ | Ar₃ |
|---|---|---|---|---|
| 145 | 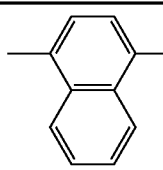 | 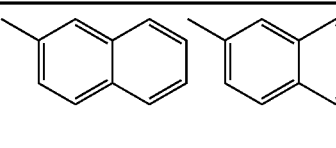 | 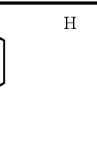 | H |
| 146 | 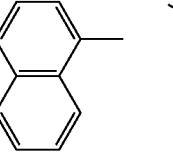 | 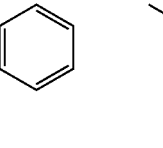 | 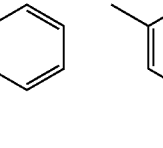 | 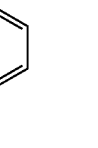 |
| 147 | 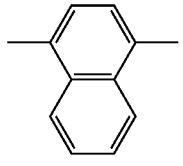 | 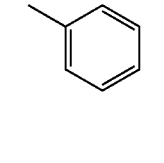 | 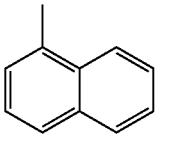 | 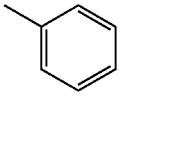 |

TABLE 5-continued
| No. | X₁ | Ar₁ | Ar₂ | Ar₃ |
|---|---|---|---|---|
| 148 | 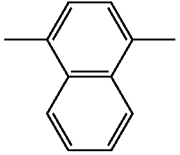 |  | 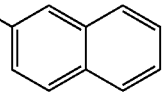 |  |
| 149 | 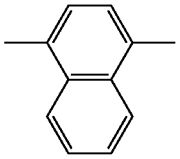 | 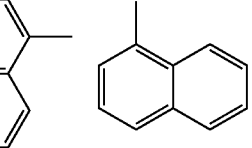 | 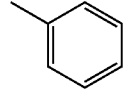 | 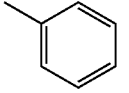 |
| 150 | 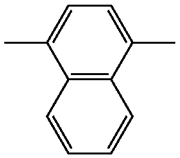 | 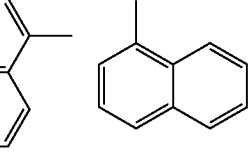 | 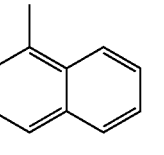 | 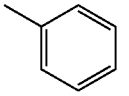 |
| 151 | 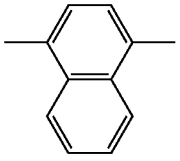 | 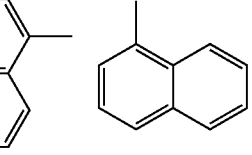 | 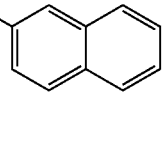 |  |
| 152 | 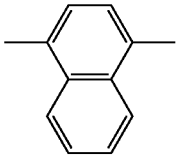 | 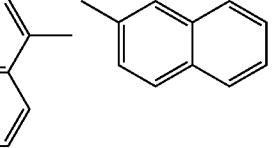 | 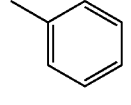 | 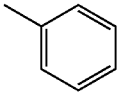 |
| 153 | 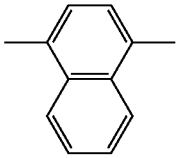 | 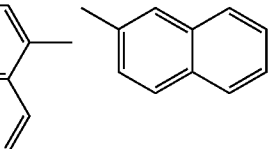 | 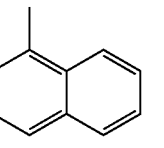 | 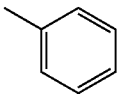 |
| 154 | 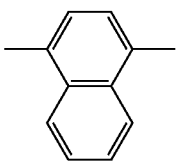 | 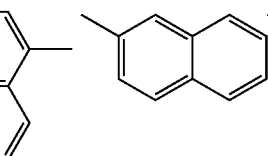 | 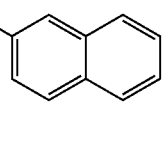 |  |
| 155 | 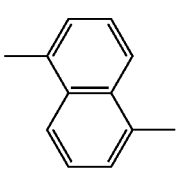 | 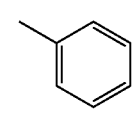 | 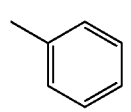 | H |

TABLE 6
| No. | $X_1$ | $Ar_1$ | $Ar_2$ | $Ar_3$ |
|---|---|---|---|---|
| 156 | 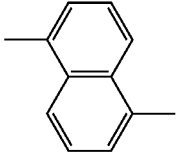 | 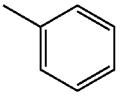 | 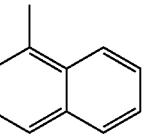 | H |
| 157 | 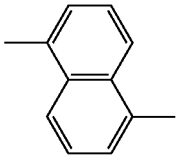 | 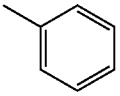 | 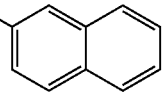 | H |
| 158 | 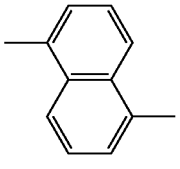 | 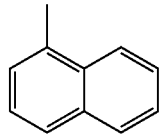 | 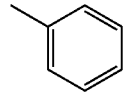 | H |
| 159 | 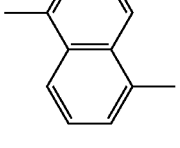 | 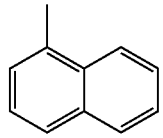 | 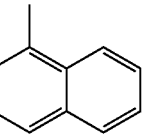 | H |
| 160 | 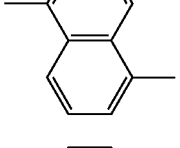 | 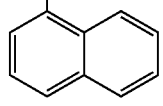 | 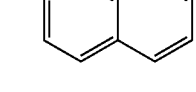 | H |
| 161 | 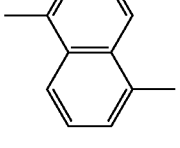 | 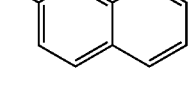 | 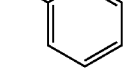 | H |
| 162 | 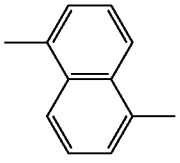 | 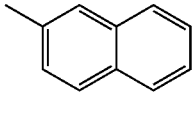 | 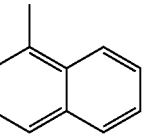 | H |
| 163 | 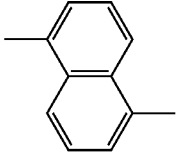 | 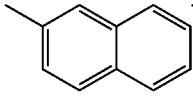 | 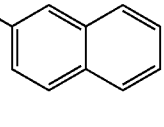 | H |
| 164 | 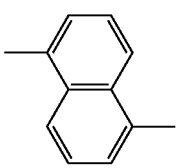 | 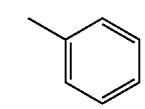 | 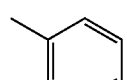 | 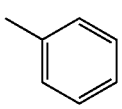 |

TABLE 6-continued
| No. | X₁ | Ar₁ | Ar₂ | Ar₃ |
|---|---|---|---|---|
| 165 | 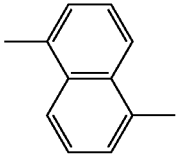 |  | 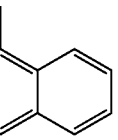 |  |
| 166 | 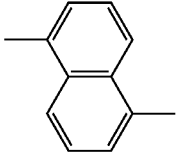 |  | 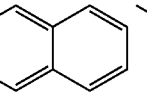 |  |
TABLE 7
| No. | X₁ | Ar₁ | Ar₂ | Ar₃ |
|---|---|---|---|---|
| 167 | 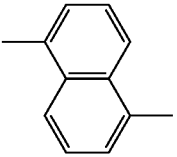 | 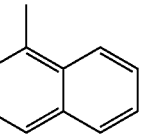 | 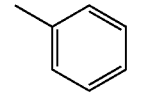 |  |
| 168 | 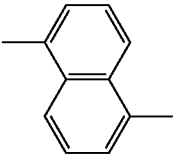 | 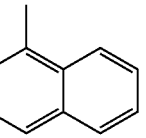 | 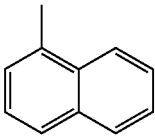 |  |
| 169 | 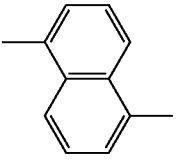 | 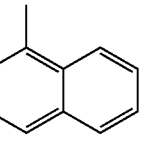 | 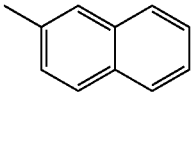 |  |
| 170 | 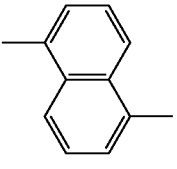 | 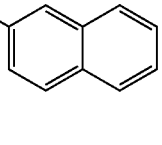 | 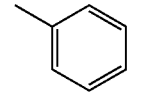 |  |
| 171 | 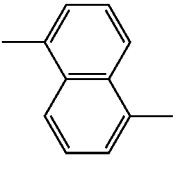 | 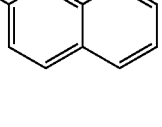 | 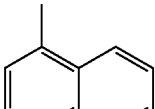 |  |
| 172 | 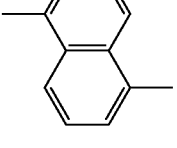 | 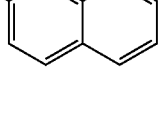 | 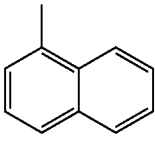 |  |
| 173 | 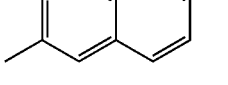 |  | 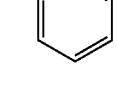 | H |

TABLE 7-continued
| No. | X₁ | Ar₁ | Ar₂ | Ar₃ |
|---|---|---|---|---|
| 174 | 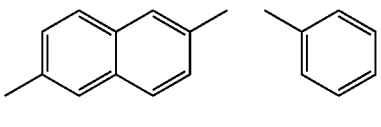 | 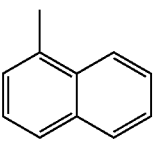 | 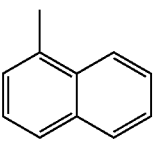 | H |
| 175 | 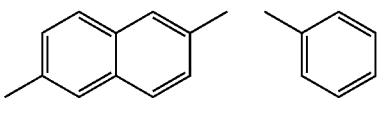 | 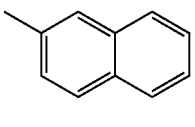 | 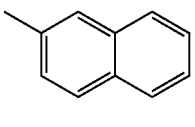 | H |
| 176 | 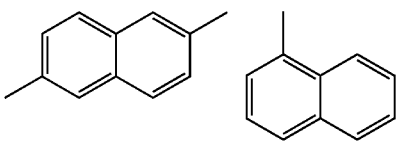 | 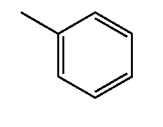 | 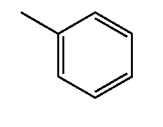 | H |
| 177 | 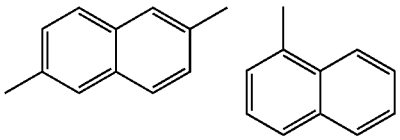 | 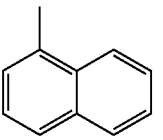 | 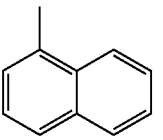 | H |
TABLE 8
| No. | X₁ | Ar₁ | Ar₂ | Ar₃ |
|---|---|---|---|---|
| 178 | 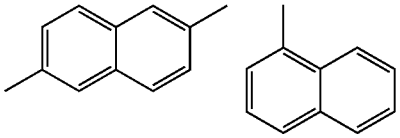 | 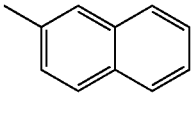 | 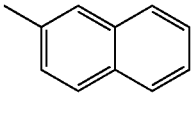 | H |
| 179 | 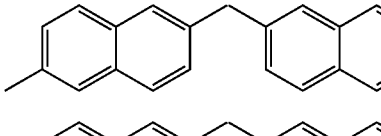 | 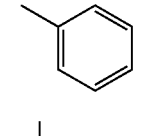 | 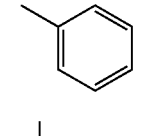 | H |
| 180 | 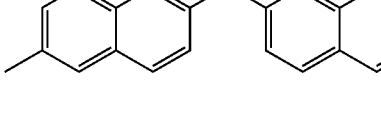 | 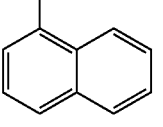 | 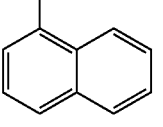 | H |
| 181 | 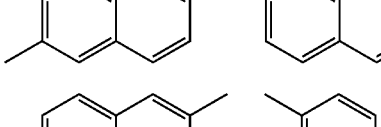 | 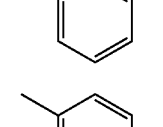 | 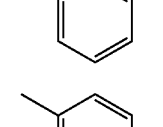 | H |
| 182 | 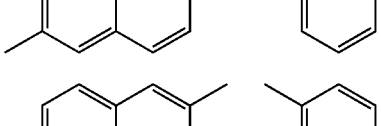 | 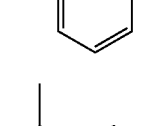 | 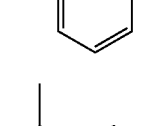 | 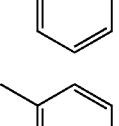 |
| 183 | 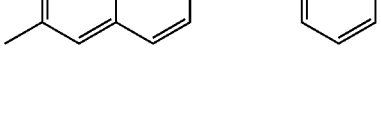 | 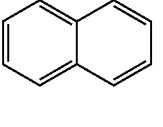 | 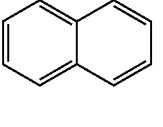 | 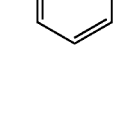 |

TABLE 8-continued
| No. | X₁ | Ar₁ | Ar₂ | Ar₃ |
|---|---|---|---|---|
| 184 | 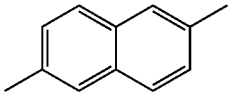 | 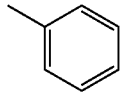 | 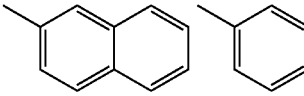 |  |
| 185 | 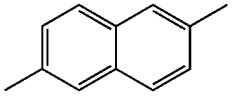 | 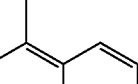 | 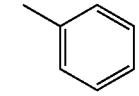 | 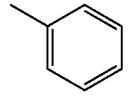 |
| 186 | 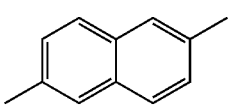 | 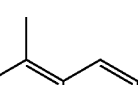 | 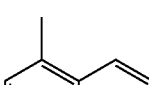 | 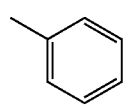 |
| 187 | 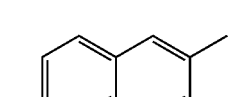 | 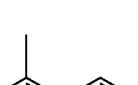 | 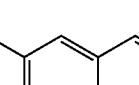 | 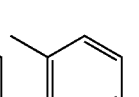 |
| 188 | 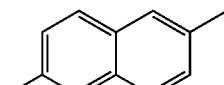 | 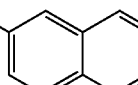 | 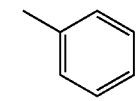 | 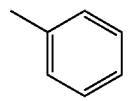 |
TABLE 9
| No. | X₁ | Ar₁ | Ar₂ | Ar₃ |
|---|---|---|---|---|
| 189 | 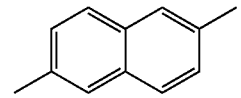 | 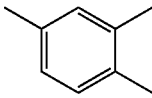 | 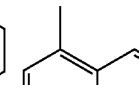 | 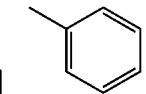 |
| 190 | 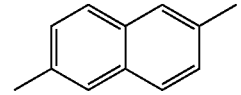 | 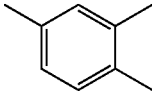 | 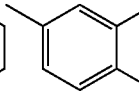 | 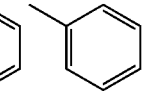 |
| 191 | 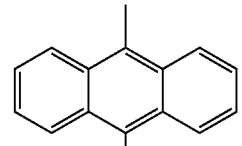 | 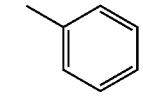 | 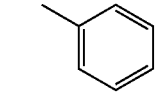 | H |
| 192 | 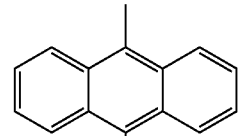 | 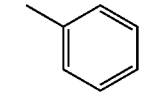 | 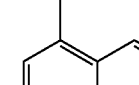 | H |

TABLE 9-continued
| No. | X₁ | Ar₁ | Ar₂ | Ar₃ |
|---|---|---|---|---|
| 193 | 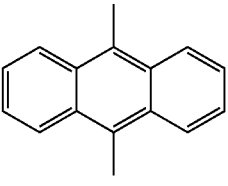 | 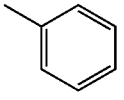 | 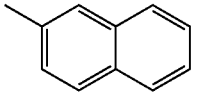 | H |
| 194 | 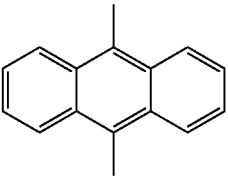 | 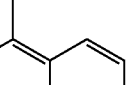 | 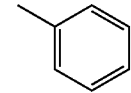 | H |
| 195 | 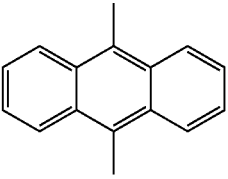 | 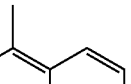 | 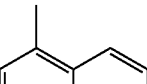 | H |
| 196 | 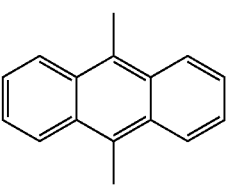 | 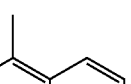 | 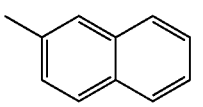 | H |
TABLE 10
| No. | X₁ | Ar₁ | Ar₂ | Ar₃ |
|---|---|---|---|---|
| 197 | 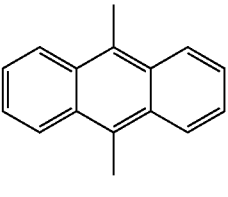 | 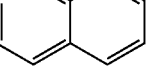 | 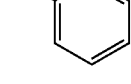 | H |
| 198 | 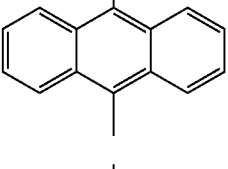 | 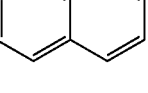 | 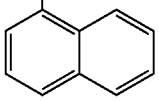 | H |
| 199 | 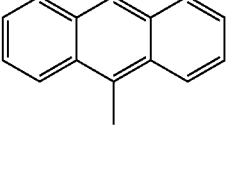 | 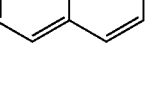 | 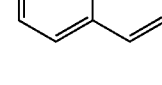 | H |

TABLE 10-continued
| No. | X₁ | Ar₁ | Ar₂ | Ar₃ |
|---|---|---|---|---|
| 200 | 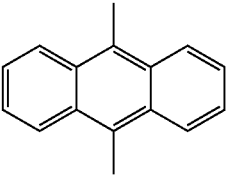 | 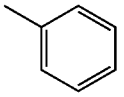 | 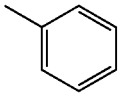 |  |
| 201 | 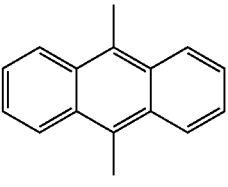 | 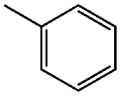 | 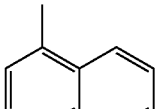 | 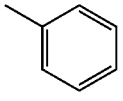 |
| 202 | 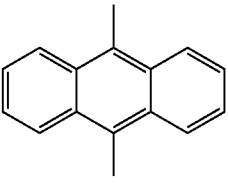 | 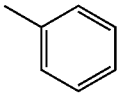 | 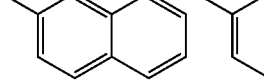 |  |
| 203 | 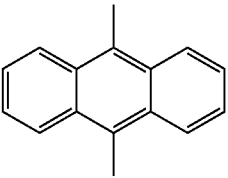 | 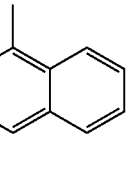 | 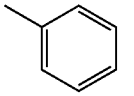 | 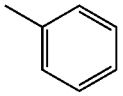 |
| 204 | 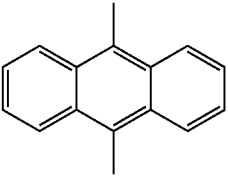 | 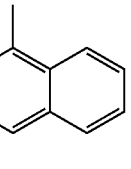 | 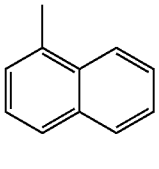 | 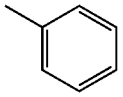 |
TABLE 11
| No. | X₁ | Ar₁ | Ar₂ | Ar₃ |
|---|---|---|---|---|
| 205 | 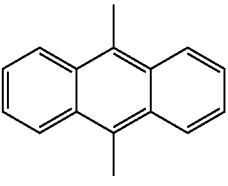 | 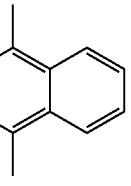 | 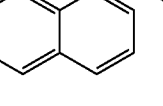 | 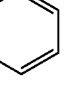 |
| 206 | 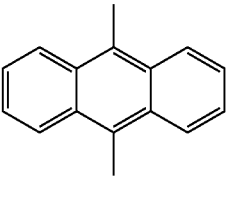 | 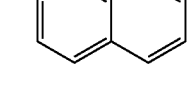 | 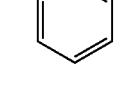 | 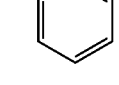 |

TABLE 11-continued

| No. | X₁ | Ar₁ | Ar₂ | Ar₃ |
|-----|----|----|----|----|
| 207 | 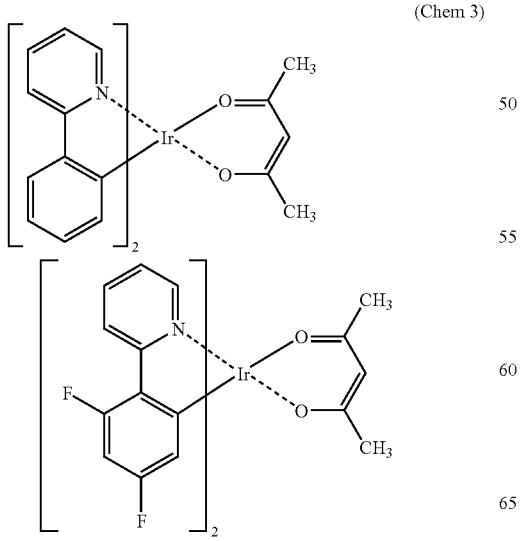 | | | |
| 208 | | | | |

An organic EL element to be obtained according to this invention comprises a secondary component, that is, a phosphorescent dopant material in its light-emitting layer. Any of the known phosphorescent metal complexes described in the aforementioned patent literature and non-patent literature can be used as a dopant material and these phosphorescent organic metal complexes preferably contain a metal selected from groups 7-11 of the periodic table at the center. This metal is preferably ruthenium, rhodium, palladium, silver, rhenium, osmium, iridium, platinum or gold. Either one kind or two kinds or more of these dopant materials and metals may be used.

Other preferred phosphorescent dopant materials are phosphorescent ortho-metalated metal complexes and porphyrin metal complexes and these metal complexes are described in patent literature 5 and elsewhere and are publicly known. Therefore, it is possible to use freely these known phosphorescent dopant materials.

Preferable organic metal complexes include Ir(bt)2.acac3 containing a noble metal such as Ir at the center (formula A), Ir(ppy)3 (formula B) and PtOEt3 (formula C). These complexes are shown below, but not limited to the examples.

(Chem 3)

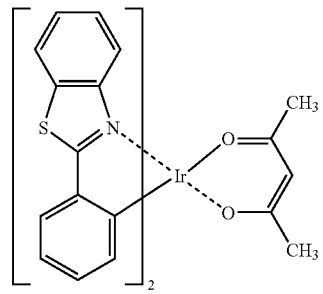

-continued

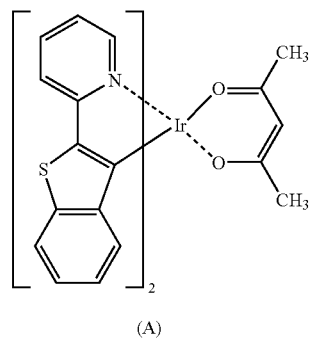

(A)

(Chem 4)

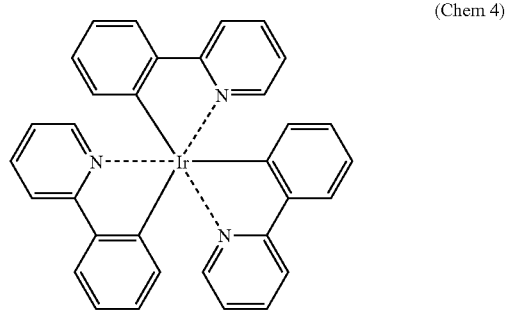

-continued
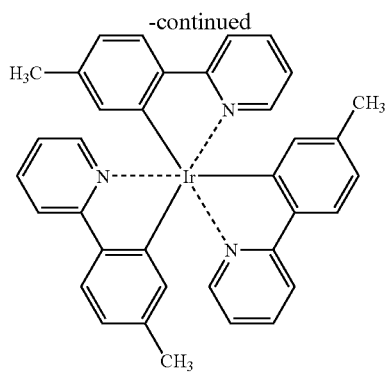
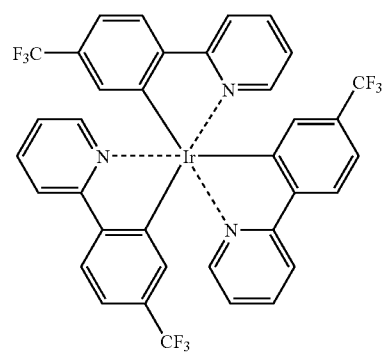
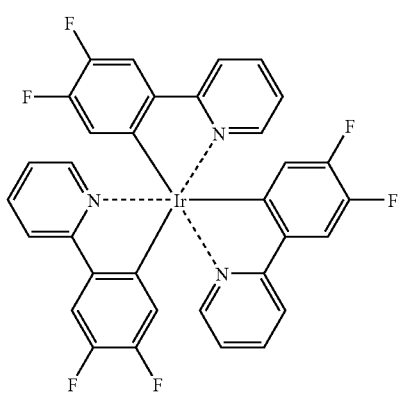
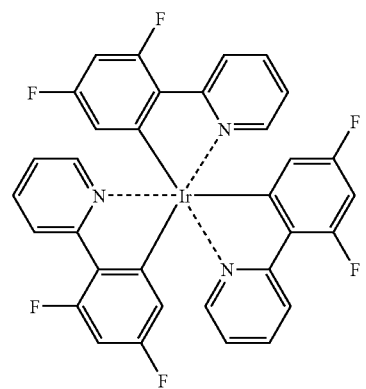
-continued
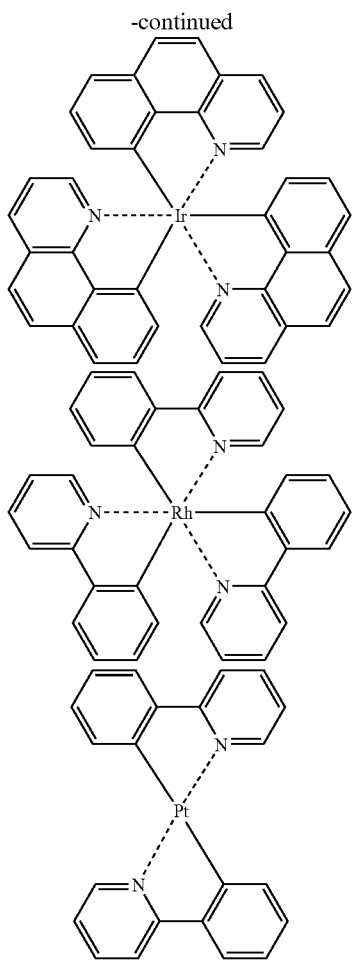
(B)
(Chem 5)
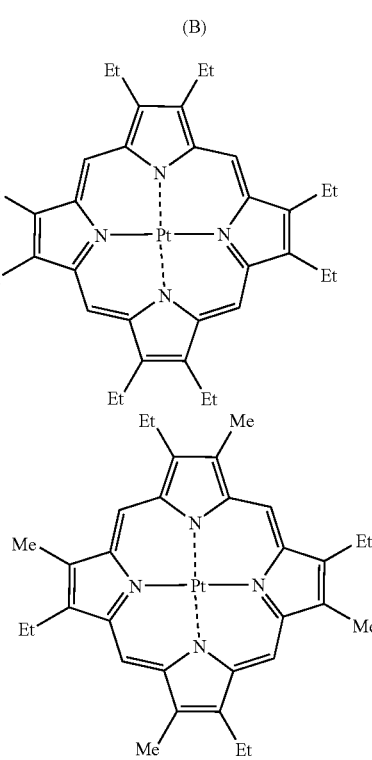

-continued

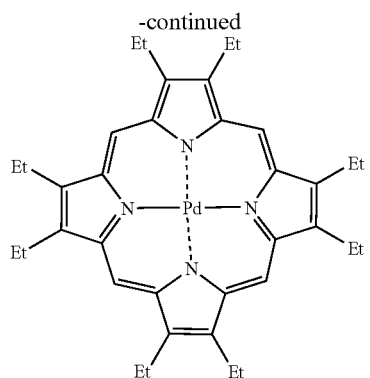

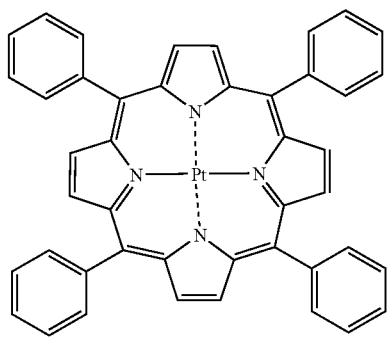

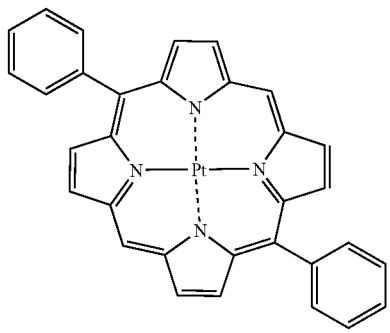

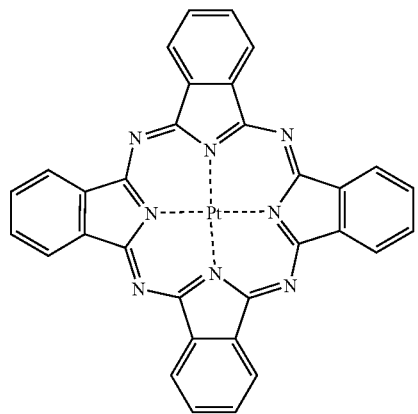

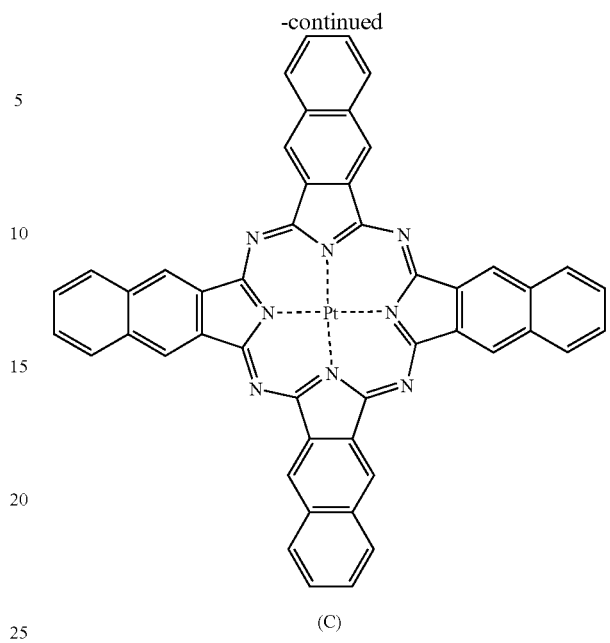

(C)

NUMBERING IN THE DRAWING

Figure 1:
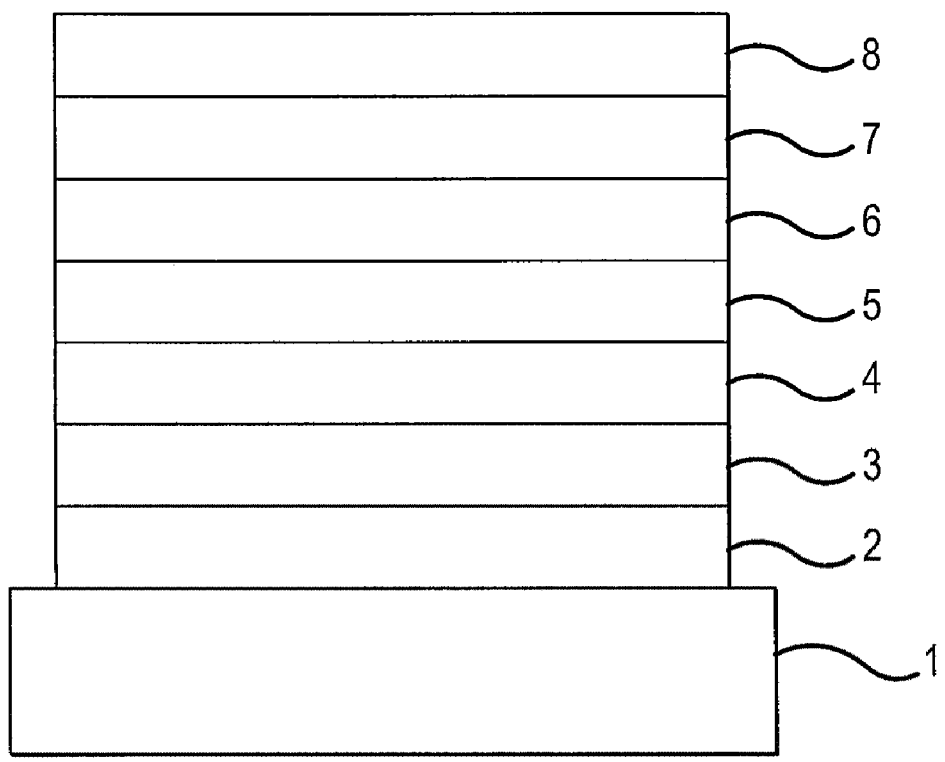
FIG. 1 is a schematic drawing illustrating the layered structure of an organic EL element.

1, substrate; 2, anode; 3, hole-injecting layer; 4, hole-transporting layer; 5, light-emitting layer; 6, hole-blocking layer; 7, electron-transporting layer; 8, cathode.

PREFERRED EMBODIMENTS OF THE INVENTION

An organic EL element of this invention will be described with reference to the drawing. In FIG. 1 is schematically illustrated the cross section of a structure generally used for an organic EL element. In FIG. 1, a substrate is designated as 1, an anode as 2, a hole-injecting layer as 3, a hole-transporting layer as 4, a light-emitting layer as 5, a hole-blocking layer as 6, an electron-transporting layer as 7 and a cathode as 8. Usually, the hole-injecting layer 3 through the electron-transporting layer 7 are organic layers and an organic EL element of this invention contains one layer or more, inclusive of the light-emitting layer 5, of such organic layers. The organic layers comprise preferably three layers or more, more preferably five layers or more, inclusive of the light-emitting layer 5. FIG. 1 shows an example of the layered structure and it is possible to add or omit one or more layers.

The substrate 1 supports an organic EL element and is made from a quartz or glass plate, a metal plate or foil or a plastic film or sheet. In particular, transparent sheets of synthetic resins such as polyester, polymethacrylate, polycarbonate and polystyrene are desirable. When a synthetic resin is used for a substrate, it is necessary to take the gas barrier property of the resin into consideration. There is an undesirable possibility of the air passing through a substrate to degrade an organic EL element when the gas barrier property of the substrate is too poor. One of the remedial methods is to provide a dense silicon oxide film on at least one side of the synthetic resin substrate to secure the necessary gas barrier property.

The anode 2 is provided on the substrate 1 and plays a role of injecting holes into the hole-transporting layer. The anode is usually constructed of a metal such as aluminum, gold, silver, nickel, palladium and platinum, a metal oxide such as oxide of indium and/or tin, a metal halide such as copper iodide, carbon black and conductive polymers such as poly (3-methylthiophene), polypyrrole and polyaniline. The anode 2 is usually formed by a technique such as sputtering and vacuum deposition. When fine particles of metal such as silver, copper iodide, carbon black, conductive metal oxides or conductive polymers are used, the particles are dispersed in a solution of a binder resin and applied to the substrate 1 to form the anode 2. Moreover, in the case of a conductive polymer, it is possible to form the anode 2 by forming a thin film of the polymer directly on the substrate 1 by electrolytic polymerization of the corresponding monomer or by coating the substrate 1 with the conductive polymer. The anode 2 may also be formed by piling different materials one upon another. The anode varies in thickness with the requirement for transparency. Where transparency is needed, it is preferable to keep the transmittance of visible light usually at 60% or more, preferably at 80% or more. In this case, the thickness is usually 5-1000 nm, preferably 10-500 nm. Where opaqueness is acceptable, the anode 2 may be the same as the substrate 1. It is possible to laminate a different conductive material on the aforementioned anode 2.

A practice adopted for the purposes of enhancing the efficiency of hole injection and improving the adhesive strength of the organic layers as a whole to the anode is to interpose the hole-injecting layer 3 between the hole-transporting layer and the anode 2. The interposition of the hole-injecting layer 3 is effective for lowering the initial driving voltage of an element and at the same time suppressing a rise in voltage when an element is driven continuously at a constant current density.

The material selected for the hole-injecting layer must satisfy the following requirements: it produces a close contact with the anode; it is capable of forming a uniform thin film; it is thermally stable, that is, it has a melting point of 300° C. or above and a glass transition temperature of 100° C. Still further, the material must have low ionization potential which facilitates hole injection from the anode and show high hole mobility.

So far, phthalocyanine compounds such as copper phthalocyanine, organic compounds such as polyaniline and polythiophene, sputtered carbon membranes and metal oxides such as vanadium oxide, ruthenium oxide and molybdenum oxide have bee reported as materials capable of attaining this object. In the case of an anode buffer layer, it is possible to form thin films in the same manner as for the hole-transporting layer. In the case of inorganic materials, it is further possible to use such methods as sputtering, electron beam evaporation and plasma CVD. The thickness of the hole-injecting layer 3 thus formed is usually 3-100 nm, preferably 5-50 nm.

The hole-transporting layer 4 is provided on the hole-injecting layer 3. The material selected for the hole-transporting layer must be capable of injecting holes from the hole-injecting layer 3 at high efficiency and transporting the injected holes efficiently. To attain this object, the material must satisfy the following requirements: it has low ionization potential, it is highly transparent against visible light, it shows high hole mobility, it is highly stable and it rarely generates impurities during manufacture or use that become traps. Still more, as the hole-transporting layer exists in contact with the light-emitting layer 5, it must not quench the light from the light-emitting layer nor form exciplexes between the light-emitting layer to lower the efficiency. Besides the aforementioned general requirements, heat resistance is additionally required where application to vehicular displays is considered. Hence, the material preferably has a Tg of 90° C. or above.

The compounds useful for such hole-transporting materials include aromatic diamines containing two tertiary amines whose nitrogen atoms are substituted with two or more aromatic condensed rings, aromatic amines of a starburst structure such as 4,4',4''-tris(1-naphthylphenylamino)triphenylamine, an aromatic amine consisting of a tetramer of triphenylamine and spiro compounds such as 2,2',7,7'-tetrakis-(diphenylamino)-9,9'-spirobifluorene. These compounds may be used singly or as a mixture.

Besides the aforementioned compounds, the materials useful for the hole-transporting layer 4 include polymeric materials such as polyvinylcarbazole, polyvinyltriphenylamine and polyaryleneethersulfones containing tetraphenylbenzidine. When the coating process is used in forming the hole-transporting layer, a coating solution is prepared by mixing one kind or more of hole-transporting materials and, if necessary, binder resins that do not become traps of holes and additives such as improvers of coating properties, the solution is applied to the anode 2 or the hole-injecting layer 3 by a process such as spin coating and the solution is dried to form the hole-transporting layer 4. The binder resins here include polycarbonate, polyarylate and polyester. Addition of a binder resin in a large amount lowers the hole mobility and it is preferably kept at a low level, usually below 50 wt %.

When the vacuum deposition process is used in forming the hole-transporting layer, the selected hole-transporting material is introduced to a crucible placed in a vacuum container, the container is evacuated to $1 \times 10^{-4}$ Pa or so by a suitable vacuum pump, the crucible is heated to evaporate the hole-transporting material and the hole-transporting layer 4 is formed on the substrate 1 which is placed opposite the crucible and on which the anode has been formed. The thickness of the hole-transporting layer 4 is usually 5-300 nm, preferably 10-100 nm. The vacuum deposition process is generally used to form such a thin film uniformly.

The light-emitting layer 5 is provided on the hole-transporting layer 4. The light-emitting layer 5 comprises the aforementioned host material and phosphorescent dopant material and, on application of an electrical field between the electrodes, the hole injected from the anode and migrating through the hole-transporting layer recombine with the electrons injected from the cathode and migrating through the electron-transporting layer 7 (or the hole-blocking layer 6) to excite the light-emitting layer thereby causing intense luminescence. The light-emitting layer 5 may contain other components, for example, non-essential host materials and fluorescent colorants to the extent that they do not damage the performance of this invention.

A host material to be used in the light-emitting layer must show a high efficiency of hole injection from the hole-transporting layer 4 and also a high efficiency of electron injection from the electron-transporting layer 7 (or the hole-blocking layer 6). To achieve this end, the host material must satisfy the following requirements; its ionization potential has an adequate value, it shows high mobility of holes and electrons, it is electrochemically stable and it rarely generates impurities during manufacture or use that becomes traps. Still more, the material must not form exciplexes between the neighboring hole-transporting layer 4 or the electron-transporting layer 7 (or the hole-blocking layer 6) to lower the efficiency.

Besides the aforementioned general requirements, heat resistance is additionally required where application of an element to vehicular displays is considered. Therefore, the material preferably has a Tg of 80° C. or above.

In the cases where one of the organic metal complexes represented by the aforementioned formulas A-C is used as a dopant material, the content of the material in the light-emitting layer is preferably in the range of 0.1-30 wt %. A content of less than 0.1 wt % does not contribute to improvement of the luminous efficiency of an element while a content in excess of 30 wt % causes quenching of light by a change in the concentration due to dimerization of molecules of the organic metal complex and the like and, as a result, the luminous efficiency drops. In the conventional elements utilizing fluorescence (singlet), it is a desirable tendency for an organic metal complex to be in an amount somewhat larger than that of a fluorescent colorant (dopant) contained in the light-emitting layer. The organic metal complex may be contained partially or distributed nonuniformly in the direction of film thickness in the light-emitting layer. The thickness of the light-emitting layer 5 is usually 10-200 nm, preferably 20-100 nm.

The light-emitting layer 5 is advantageously formed by the vacuum deposition process. A host material and a dopant material are introduced together to a crucible placed in a vacuum container, the container is evacuated to $1 \times 10^{-4}$ Pa or so by a suitable vacuum pump, the crucible is heated to evaporate both host material and dopant material and both materials are deposited on the hole-transporting layer 4. The rates of deposition of the host material and dopant material are monitored separately to control the content of the dopant material in the host material.

The hole-blocking layer 6 is formed on the light-emitting layer 5 so that the blocking layer contacts the light-emitting layer 5 on the cathode side and it is formed by a compound which is capable of playing a role of inhibiting the holes that are migrating through the hole-transporting layer from reaching the cathode and capable of transporting the electrons that are injected from the cathode in the direction of the light-emitting layer efficiently. The properties required for a material constituting the hole-blocking layer are high electron mobility and low hole mobility. The hole-blocking layer 6 has a function of confining holes and electrons in the light-emitting layer thereby improving the luminous efficiency.

The electron-transporting layer 7 is formed from a compound which is capable of transporting the electrons that are injected from the cathode towards the hole-blocking layer 6 upon application of an electrical field between the electrodes. An electron-transporting compound useful for the electron-transporting layer 7 is required to show high efficiency of electron injection from the cathode 8 and have a high electron mobility to enable efficient transportation of the injected electrons.

The materials satisfying these requirements include metal complexes such as 8-hydroxyquinoline aluminum complex (Alq3), 10-hydroxybenzo[h]quinoline metal complexes, distyrylbiphenyl derivatives, silole derivatives, 3- or 5-hydroxyflavone metal complexes, benzoxazole metal complexes, benzothiazole metal complexes, trisbenzimidazolylbenzene, quinoxaline compounds, phenanthroline derivatives, 2-t-butyl-9,10-N,N'-dicyanoanthraquinonediimine, n-type hydrogenated amorphous silicon carbide, n-type zinc sulfide and n-type zinc selenide. The thickness of the electron-transporting layer 7 is usually 5-200 nm, preferably 10-100 nm.

The electron-transporting layer 7 is formed on the hole-blocking layer 6 by a process such as coating or vacuum deposition as in the formation of the hole-transporting layer 4. The vacuum deposition process is normally used.

The cathode 8 plays a role of injecting electrons to the light-emitting layer 5. A material useful for the cathode 8 may be the same as the aforementioned material for the anode 2. However, a preferred material is a metal of low work function such as tin, magnesium, indium, calcium, aluminum and silver and alloys thereof. Concrete examples are alloy electrodes of low work function such as magnesium-silver alloys, magnesium-indium alloys and aluminum-lithium alloys. Furthermore, insertion of an ultrathin insulating film (0.1-5 nm) of LiF, $MgF_2$, $Li_2O$ and the like to the interface of the cathode and the electron-transporting layer is an effective method for improving the efficiency of an element. The thickness of the cathode 8 is usually the same as that for the anode 2. To protect a cathode made from a metal of low work function, the cathode is covered with a layer of a metal of high work function and good stability in the air and this improves the stability of an element. Metals such as aluminum, silver, copper, nickel, chromium, gold and platinum are used for this purpose.

It is possible to obtain an element having a structure which is the reverse of the structure shown in FIG. 1: for example, one element is formed by piling one upon another the cathode 8, the hole-blocking layer 6, the light-emitting layer 5, the hole-transporting layer 4 and the anode 2 on the substrate 1 and another element is formed in such a manner as to have a structure of substrate 1/anode 8/electron-transporting layer 7/hole-blocking layer 6/light-emitting layer 5/hole-transporting layer 4/hole-injecting layer 3/anode 2.

EXAMPLES

Synthetic Example 1

In a 300-ml four-necked flask were placed 10.9 g (0.27 mole) of sodium hydroxide, 52.7 g of ethanol and 98.3 g of deionized water. The mixture was stirred at room temperature for 10 minutes until the sodium hydroxide dissolved and 26.1 g (0.22 mole) of acetophenone was added. Thereafter, the mixture was cooled by ice water and 14.1 g (0.11 mole) of terephthaldehyde was added. After the addition, the mixture was heated under reflux with stirring for 4 hours. Upon completion of the reaction, the reaction mixture was cooled to room temperature and a solid was collected by filtration. The solid was made into a slurry by ethanol and dried under reduced pressure to give 28.5 g of a yellow powder. This powder was analyzed by thin-layer chromatography (TLCG) to be a single product. Analysis of this product by mass spectrometry showed that its molecular weight was 338 and identical with that of the target compound calcone. The yield of the isolated product was 80.1%.

Synthetic Example 2

In a 2000-ml four-necked flask were placed 20.1 g (0.36 mole) of potassium hydroxide and 1482.7 g of ethanol. The mixture was stirred at room temperature until the potassium hydroxide dissolved and 32.8 g (0.10 mole) of the calcone obtained in Synthetic Example 1 was added at room temperature. Further, 40.4 g (0.37 mole) of phenylhydrazine was added at room temperature. After the addition, the mixture was heated under reflux with stirring for 2.5 hours. Upon completion of the reaction, the reaction mixture was cooled to room temperature and a solid was collected by filtration. The solid was washed with methanol and hexane and dried under reduced pressure to give 42.1 g of a yellow powder. This powder was confirmed to be a single product by TLCG. Analysis of this product by mass spectrometry showed that its molecular weight was 518 and identical with that of the target pyrazoline compound. The yield was 83.7%.

Synthetic Example 3

In a 500-ml four-necked flask was placed 354.4 g (4.480 moles) of pyridine. Then, 57.6 g (0.19 mole) of antimony pentachloride was added slowly in drops so that no vigorous generation of heat occurred. After the dropwise addition, the mixture was allowed to cool to room temperature and 25.9 g (0.050 mole) of the pyrazoline compound obtained in Synthetic Example 2 was added. After this addition, the mixture was stirred at room temperature for 3.5 hours. Upon completion of the reaction, a solid was recovered by filtration. The solid was washed with ethanol to give 42.1 g of a pale brown powder. The powder was recrystallized twice from methylene chloride to give 18.3 g of white crystals. Analysis of the crystals by TLCG confirmed the formation of a single product and analysis of the product by mass spectrometry showed that its molecular weight was 514 and identical with that of the target compound 5,5'-(1,4-phenylene)bis[1,3-diphenyl-1H-pyrazole] (hereinafter referred to as PBP). The melting point was 246.8° C., the yield was 71.4% and the compound PBP corresponds to compound No. 101 in Table 1.

The results of the infrared analysis of PBP are shown below.

IR (KBr) 3061, 3047, 1595, 1499, 1487, 1460, 1427, 1358, 1215, 1178, 1082, 1066, 972, 954, 847, 795, 773, 764, 696, 602

The sequence of reactions in Synthetic Examples 1-3 are shown below.

(Chem 6)

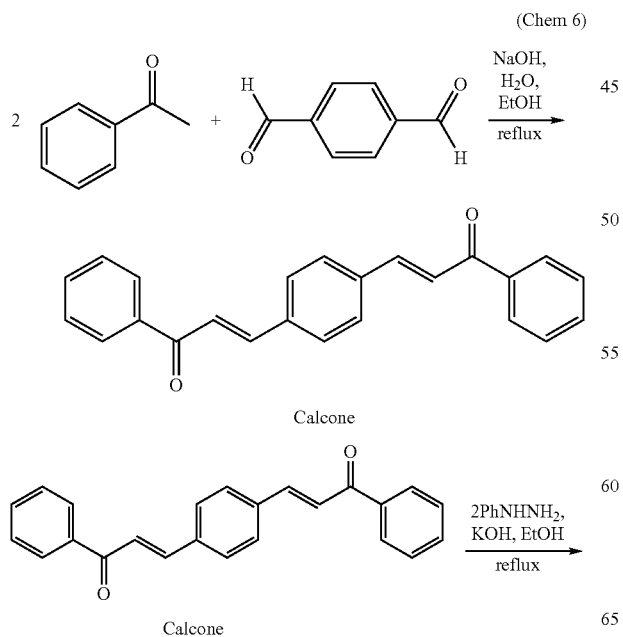

Calcone

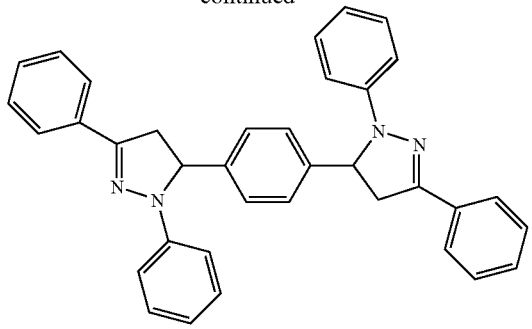

-continued

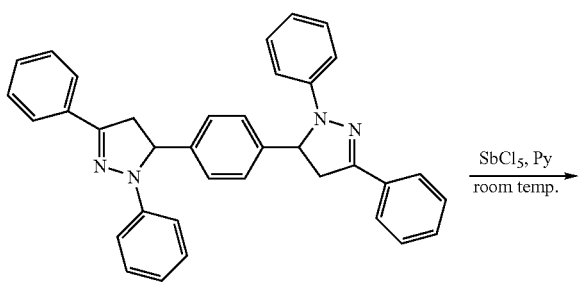

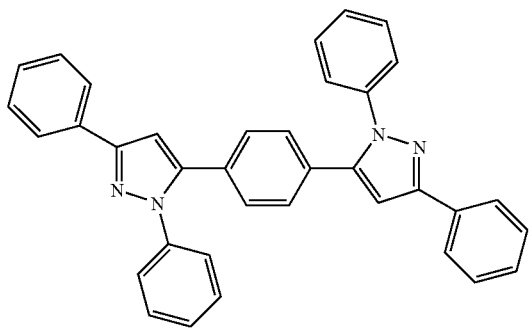

Synthetic Example 4

The same procedure as adopted in Synthetic examples 1-3 was followed with the exception of using 11.0 g (0.28 mole) of sodium hydroxide, 54.0 g of ethanol, 100.1 g of deionized water, 37.0 g (0.22 mole) of 1-acetonaphthone in place of acetophenone and 14.0 g (0.10 mole) of terephthaldehyde to synthesize 5,5'-(1,4-phenylene)bis[1-phenyl-3-(1-naphthyl)-1H-pyrazole] (hereinafter referred to as PBNP). The purity of PBNP was 100% (ratio of area in HPLC), the mass obtained in mass spectrometry was 614 and the melting point was 230.2° C. The compound PBNP corresponds to compound No. 104.

The results of the infrared analysis of PBNP are shown below.

IR (KBr) 3047, 1595, 1514, 1501, 1431, 1381, 1360, 1321, 1032, 972, 937, 912, 849, 814, 802, 773, 739, 692, 660

The sequence of reactions in Synthetic Example 4 is shown below.

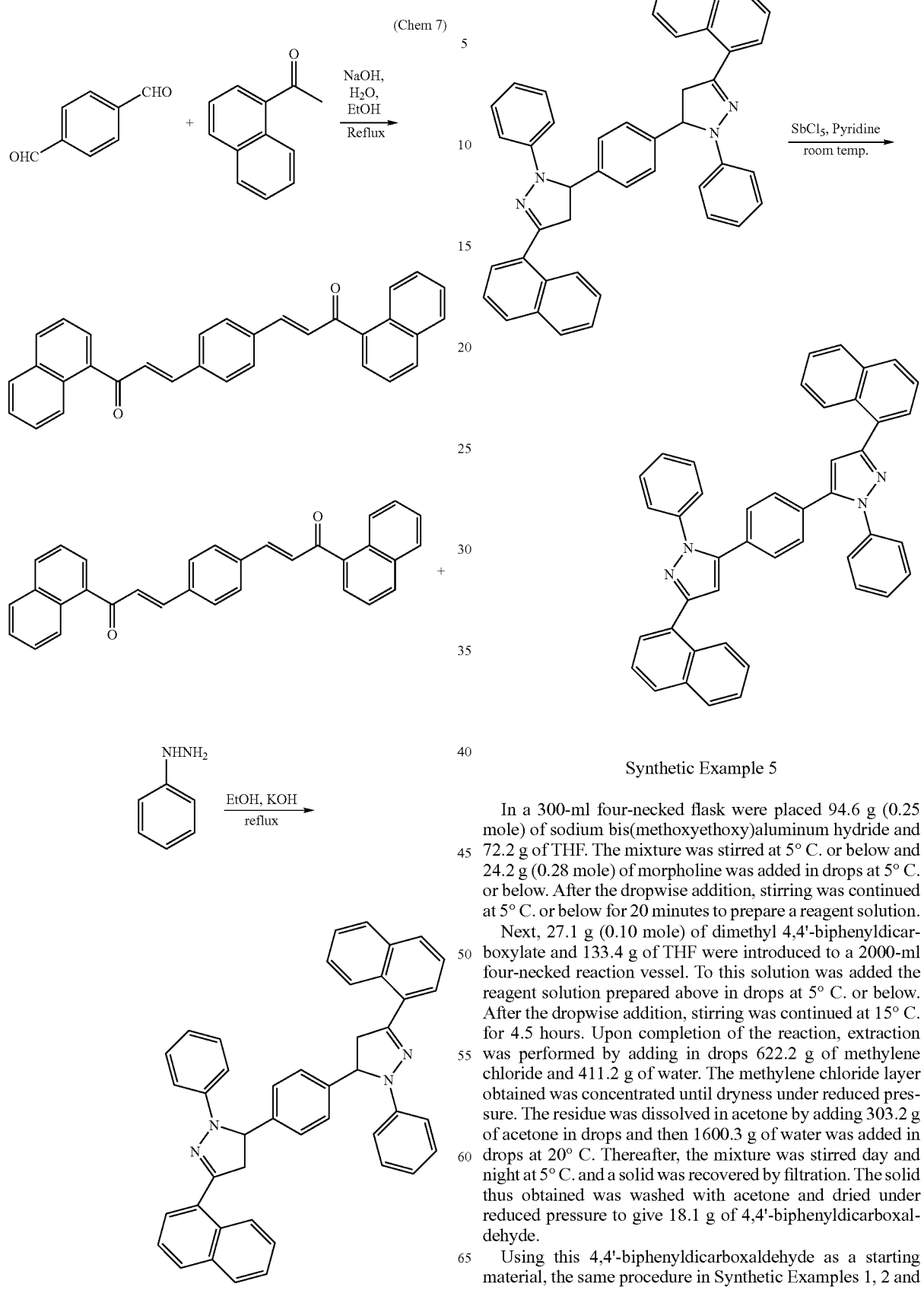

Synthetic Example 5

In a 300-ml four-necked flask were placed 94.6 g (0.25 mole) of sodium bis(methoxyethoxy)aluminum hydride and 72.2 g of THF. The mixture was stirred at 5° C. or below and 24.2 g (0.28 mole) of morpholine was added in drops at 5° C. or below. After the dropwise addition, stirring was continued at 5° C. or below for 20 minutes to prepare a reagent solution.

Next, 27.1 g (0.10 mole) of dimethyl 4,4'-biphenyldicarboxylate and 133.4 g of THF were introduced to a 2000-ml four-necked reaction vessel. To this solution was added the reagent solution prepared above in drops at 5° C. or below. After the dropwise addition, stirring was continued at 15° C. for 4.5 hours. Upon completion of the reaction, extraction was performed by adding in drops 622.2 g of methylene chloride and 411.2 g of water. The methylene chloride layer obtained was concentrated until dryness under reduced pressure. The residue was dissolved in acetone by adding 303.2 g of acetone in drops and then 1600.3 g of water was added in drops at 20° C. Thereafter, the mixture was stirred day and night at 5° C. and a solid was recovered by filtration. The solid thus obtained was washed with acetone and dried under reduced pressure to give 18.1 g of 4,4'-biphenyldicarboxaldehyde.

Using this 4,4'-biphenyldicarboxaldehyde as a starting material, the same procedure in Synthetic Examples 1, 2 and 3 was followed to synthesize 4,4'-bis(1,3-diphenyl-5-pyrazolyl)biphenyl (hereinafter referred to as BPPP). The purity was 99.6% (area ratio in HPLC), the mass obtained in mass spectrometry was 590 and the melting point was 241.0° C. The compound BPPP corresponds to compound No. 119.
The results of the infrared analysis of BPPP are shown below.
IR (KBr) 3061, 3049, 3028, 1595, 1497, 1456, 1425, 1398, 1362, 1213, 1182, 1069, 1005, 970, 955, 829, 806, 766, 692, 681, 600
The reaction sequence in Synthetic Example 5 is shown below.
(Chem 8)
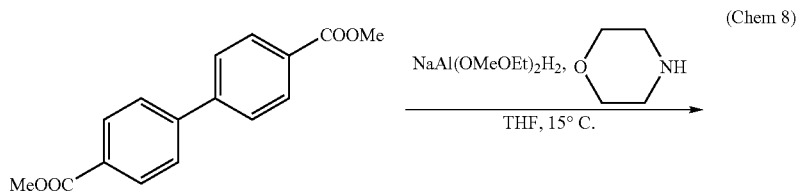
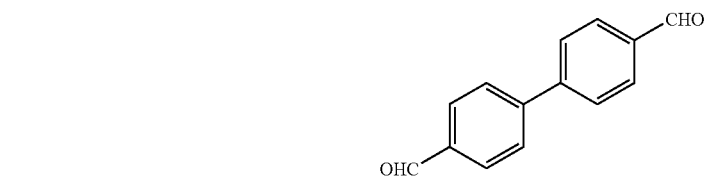
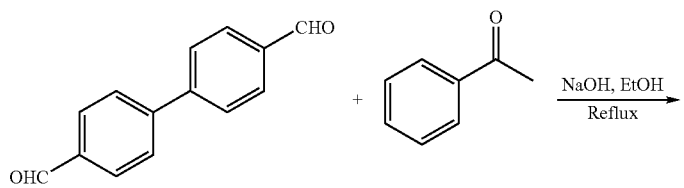
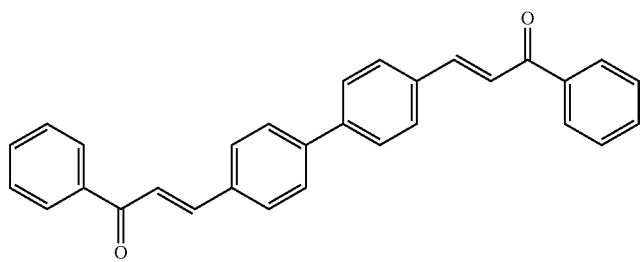
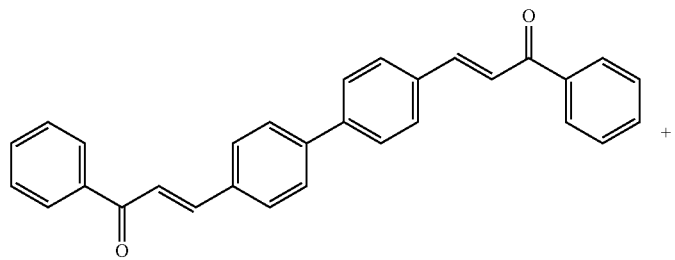

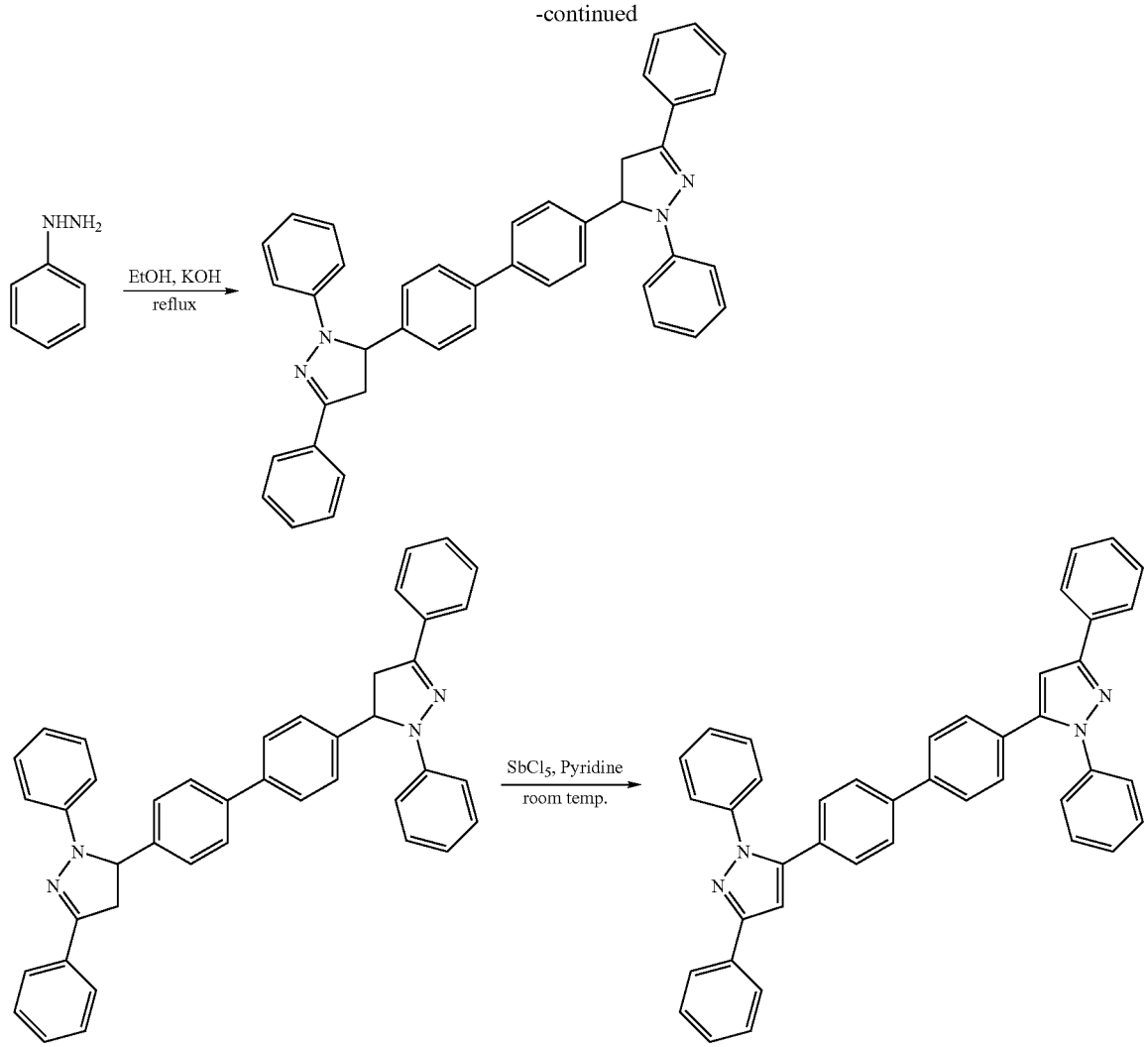

Synthetic Example 6

In a 300-ml four-necked flask were placed 94.6 g (0.25 mole) of sodium bis(methoxyethoxy)aluminum hydride and 72.2 g of THF. The mixture was stirred at 5° C. or below and 24.2 g (0.28 mole) of morpholine was added in drops at 5° C. or below. After the dropwise addition, the mixture was stirred continuously at 5° C. or below for 20 minutes to prepare a reagent solution.

Thereafter, the procedure in Synthetic Example 5 was followed with the exception of substituting dimethyl 2,6-naphthalenedicarboxylate for dimethyl 4,4'-biphenyldicarboxylate and using 12.2 g of THF to synthesize 2,6-bis(1,3-diphenyl-5-pyrazolyl)naphthalene (hereinafter referred to as BPN). The purity was 99.38% (area ratio in HPLC), the mass obtained in mass spectrometry was 564 and the melting point was 251.7° C. The compound BPN corresponds to compound No. 173.

The results of the infrared analysis of BPN are shown below.

IR (KBr) 3063, 3047, 1597, 1547, 1497, 1456, 1437, 1416, 1364, 1327, 1219, 1161, 1074, 988, 957, 895, 862, 818, 806, 766, 694, 677, 662

The reaction sequence in Synthetic Example 6 is shown below.

(Chem 9)

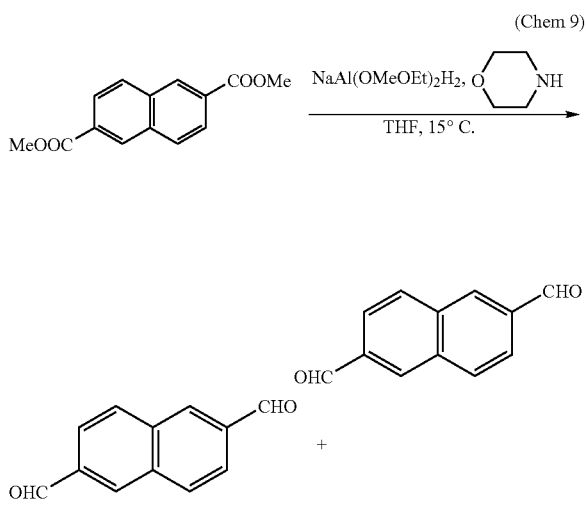

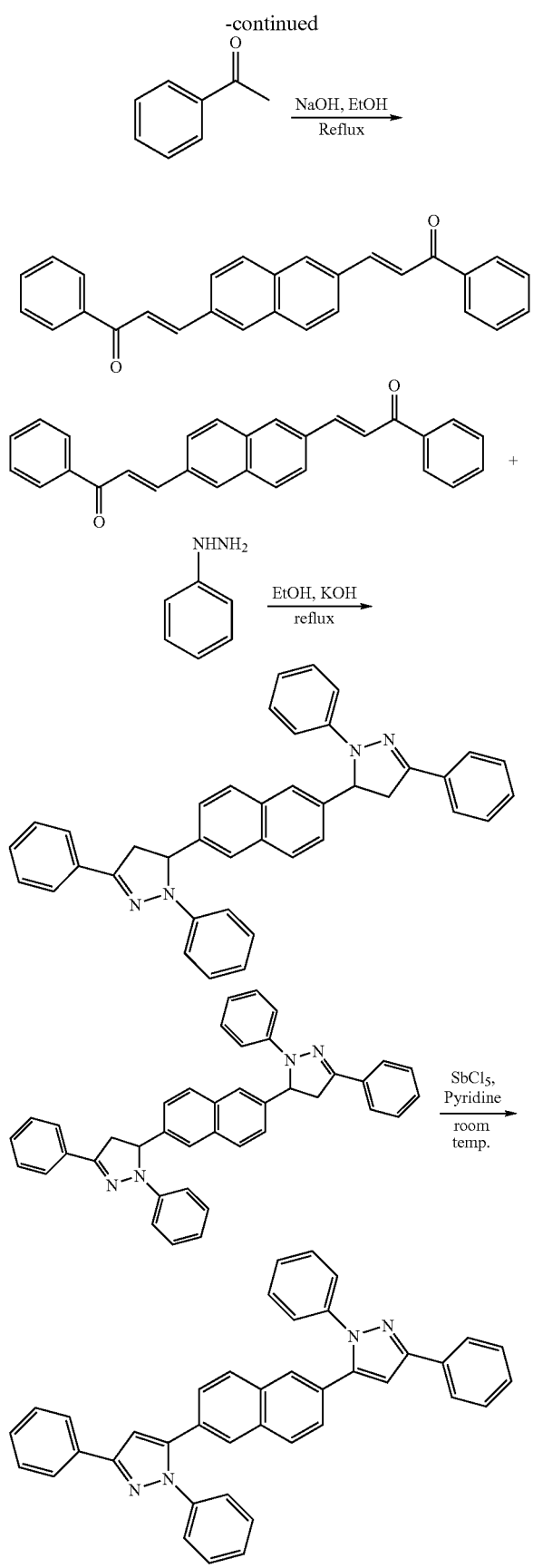

Synthetic Example 7

In 200-ml four-necked flask were placed 29.4 g (0.15 mole) of deoxybenzoin, 10.0 g (0.07 mole) of terephthaldehyde and 77.9 g of benzene. The mixture was stirred at room temperature and 2.6 g (0.03 mole) of piperidine was added at room temperature. After the dropwise addition, the mixture was heated under reflux with stirring for 18 hours while removing water from an ester tube. Upon completion of the reaction, the reaction mixture was cooled to room temperature and a solid was recovered by filtration. The crystals obtained were washed with benzene and dried under reduced pressure to give 28.8 g of 3,3'-(1,4-phenylene)bis(1,2-diphenyl-2-propen-1-one).

Then, 20.0 g (0.04 mole) of the 3,3'-(1,4-phenylene)bis(1,2-diphenyl-2-propen-1-one) obtained above, 497.2 g of ethylene glycol and 35.5 g (0.33 mole) of phenylhydrazine were introduced to a 1000-ml four-necked flask at room temperature. After the addition, the mixture was heated under reflux with stirring for 1.5 hours. Upon completion of the reaction, the reaction mixture was cooled to room temperature and a solid was recovered by filtration. The crystals obtained were dissolved in methylene chloride and the insoluble matters were filtered off. The filtrate was concentrated to dryness under reduced pressure. To the residue was added in drops 762.3 g of methanol and the mixture was heated with stirring for 30 minutes. After the stirring was over, the mixture was cooled to room temperature and a solid was recovered by filtration. The crystals obtained were washed with methanol and dried under reduced pressure to give 5.6 g of 5,5'-(1,4-phenylene)bis(1,3,4-triphenyl-2-pyrazoline).

Next, 93.1 g (1.18 moles) of pyridine was introduced to a 200-ml four-necked flask. Thereafter, 17.5 g (0.06 mole) of antimony pentachloride was added in drops over 10 minutes so that vigorous generation of heat did not occur. After the dropwise addition, the mixture was allowed to cool to room temperature and 10.4 g (0.015 mole) of the 5,5'-(1,4-phenylene)bis(1,3,4-triphenyl-2-pyrazoline) obtained above was added. After the addition, the mixture was stirred at room temperature for 18 hours. Upon completion of the reaction, a solid was recovered by filtration. The solid was washed with ethanol and dried under reduced pressure to give 4.9 g of white crystals. The crystals were dissolved in methylene chloride and the insoluble matters were filtered off. The filtrate was concentrated to dryness under reduced pressure. The residue was recrystallized from methylene chloride to give 2.4 g of purified white crystals of 5,5'-(1,4-phenylene)bis(1,3,4-triphenyl-1H-pyrazole) (hereinafter referred to as 4-Ph-PBP). The purity (area ratio in HPLC) was 100%, the mass obtained in mass spectrometry was 666, and the melting point was 312.3° C. The compound 4-Ph-PBP corresponds to compound No. 110.

The results of the infrared analysis of 4-Ph-PBP are shown below.

IR (KBr) 3051, 3034, 1597, 1497, 1452, 1431, 1358, 1323, 1182, 1138, 1074, 1026, 968, 908, 854, 775, 760, 752, 700, 658

The sequence of reactions in Synthetic Example 7 is shown below.

(Chem 10)

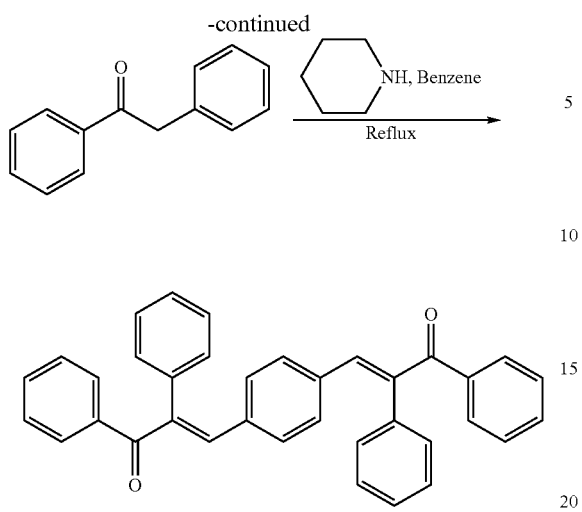

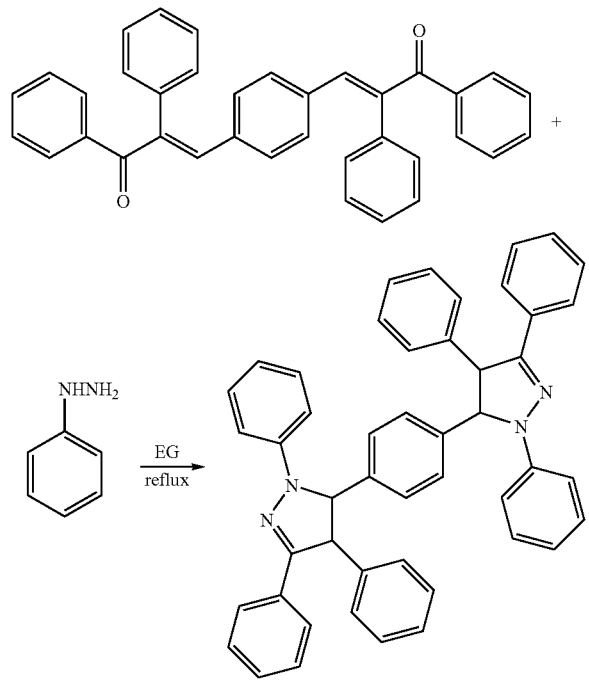

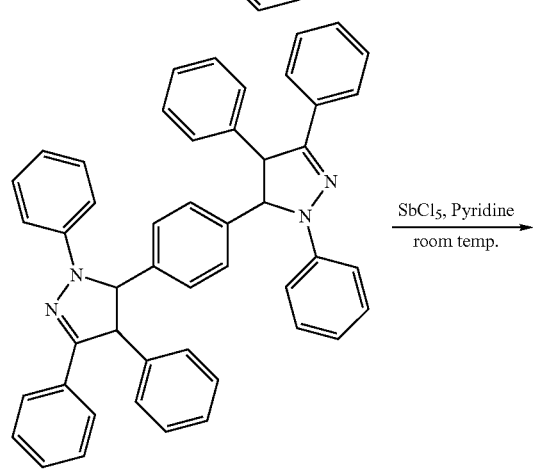

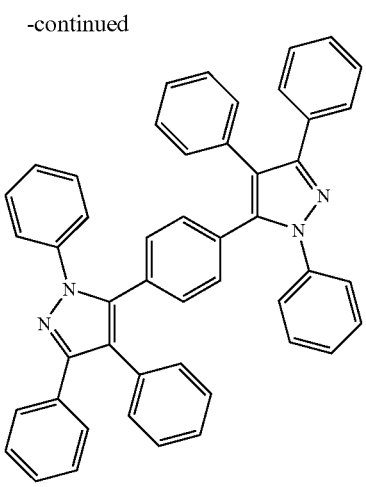

Supplementary Example 1

To examine the heat resistance of the candidate compounds for the primary component (host material) of the light-emitting layer, the glass transition temperature (Tg) of these compounds was determined by differential scanning calorimetry (DSC). The compounds are known host materials and abbreviated as follows; TAZ for 3-phenyl-4-(1'-naphthyl)-5-phenyl-1,2,4-triazole, CBP for 4,4'-N,N'-dicarbazolediphenyl, BCP for 2,9-dimethyl-4,7-diphenyl-1,10-phenanthroline and OXD-7 for 1,3-bis[(4-t-butylphenyl)-1,3,4-oxadiazolyl]phenylene. The results are shown in Table 12.

TABLE 12

| Host material | Glass transition temperature (Tg) (° C.) |
| --- | --- |
| PBP | 86 |
| PBNP | 98 |
| BPPP | 106 |
| BPN | 96 |
| 4-Ph-PBP | —[1] |
| TAZ | —[1] |
| CBP | —[1] |
| BCP | —[1] |
| OXD-7 | —[1] |

[1] Not observed

Supplementary Example 2

The stability of the thin films of these host materials was evaluated as follows. The host material alone was vacuum-deposited on a glass substrate to a film thickness of 100 nm. The vacuum-deposited film was then stored in an atmosphere where the temperature was kept at 25° C. and the humidity at 30% and the film was visually observed to see how many days would elapse until it starts to crystallize. The results are shown in Table 13.

TABLE 13

| Host material | Number of days to start of crystallization |
| --- | --- |
| PBP | 16 days |
| PBNP | 64 days |

TABLE 13-continued

| Host material | Number of days to start of crystallization |
|---|---|
| BPPP | 55 days |
| BPN | 62 days |
| 4-Ph-PBP | 38 days |
| TAZ | 4 days |
| CBP | 6 days |
| BCP | 5 days |
| OXD-7 | 3 days |

Example 1

An organic EL element having the layered structure shown in FIG. 1 less the hole-injecting layer 3 and the hole-blocking layer 6 was prepared as follows.

The anode 2 was formed by patterning a 2 mm-wide stripe of a transparent conductive ITO film (available from GEO-MATEC Co., Ltd.) on the glass substrate 1, submitted successively to cleaning with pure water, ultrasonic cleaning with acetone and ultrasonic cleaning with isopropyl alcohol, dried by nitrogen blowing, submitted finally to ultraviolet/ozone cleaning and set up in an apparatus for vacuum deposition.

The apparatus was exhausted preliminarily by an oil rotary pump and then exhausted by an oil diffusion pump equipped with a liquid nitrogen trap until the degree of vacuum in the apparatus reached $(5-9) \times 10^{-4}$ Pa. The hole-transporting layer 4 was formed by heating a molybdenum boat containing 4,4'-bis[N,N'-(3-tolyl)amino]-3,3'-dimethylbiphenyl (HMTPD) and depositing the compound to a film thickness of 60 nm. On this layer was formed the light-emitting layer 5 by co-depositing PBP as the primary component and tris(2-phenylpyridine)iridium complex (Ir(ppy)3) as the phosphorescent organic metal complex from different evaporation sources to a film thickness of 25 nm. The concentration of Ir(ppy)3 at this point was 7 wt %. Thereafter, a film of Alq3 with a thickness of 50 nm was formed as the electron-transporting layer 7.

The element having the organic layers was taken out of the apparatus into the air, attached to a mask for vapor deposition of the cathode or a shadow mask in the form of a 2 mm-wide stripe so that the stripe met at right angles with the ITO stripe of the anode 2 and set up in another vacuum apparatus. After exhausting the apparatus as in the formation of the organic layers, lithium fluoride (LiF) as the electron-injecting layer was deposited on the electron-transporting layer to a thickness of 0.5 nm and aluminum as the cathode was deposited to a thickness of 170 nm.

The organic electroluminescent element thus obtained was connected to an external power source and, when direct current voltage was applied, showed the light-emitting characteristics shown in Table 14. In Table 14, the luminous efficiency is a value at 1000 cd/m², luminance/current means the slope of luminance-current density characteristics and the voltage is a value at 1000 cd/m². The maximum wavelength of the spectrum observed in emission of light from the element is 515 nm and this confirms that Ir(ppy)3 emits light.

Example 2

An organic EL element was prepared as in Example 1 with the exception of using PBNP as the primary component of the light-emitting layer 5. Emission of light from Ir(ppy)3 was also confirmed for this organic EL element.

Example 3

An organic EL element was prepared as in Example 1 with the exception of using BPPP as the primary component of the light-emitting layer 5. The characteristics of this element are shown in Table 14.

Example 4

An organic EL element was prepared as in Example 1 with the exception of using BPN as the primary component of the light-emitting layer 5. Emission of light from Ir(ppy)3 was also confirmed for this organic EL element.

Example 5

An organic EL element was prepared as in Example 1 with the exception of using 4-Ph-PBP as the primary component of the light-emitting layer 5. The characteristics of this element are shown in Table 14.

Comparative Example 1

An organic EL element was prepared as in Example 1 with the exception of using TAZ as the primary component of the light-emitting layer 5. The characteristics of this element are shown in Table 14.

TABLE 14

| | Luminance/current (cd/A) | Voltage (V) @1000 cd/m2 | Luminous efficiency (lm/W) @1000 cd/m2 |
|---|---|---|---|
| Example 1 | 41.03 | 12.2 | 10.30 |
| Example 3 | 38.30 | 11.0 | 10.94 |
| Example 5 | 28.06 | 12.3 | 7.25 |
| Comp. Ex. 1 | 26.11 | 13.4 | 7.13 |

INDUSTRIAL APPLICABILITY

This invention provides a phosphorescent organic electroluminescent element with improved luminous efficiency, driving stability and heat resistance applicable to display devices such as flat panel displays and illuminating devices.

What is claimed is:

1. An organic electroluminescent element comprising an anode, organic layers and a cathode piled one upon another on a substrate wherein at least one of the organic layers is a light-emitting layer containing a host material and a dopant material and a pyrazole-derived compound represented by the following formula II is used as said host material:

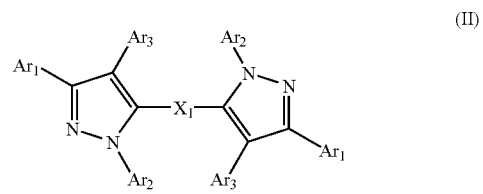

(II)

wherein, $Ar_1$ and $Ar_2$ are independently hydrogen or substituted or unsubstituted aromatic hydrocarbon groups, at least one of $Ar_1$ and $Ar_2$ is a group other than hydrogen, $X_1$ is a direct bond or a substituted or unsubstituted divalent aromatic hydrocarbon group, and $Ar_3$ is hydrogen.

2. An organic electroluminescent element as described in claim 1 wherein $Ar_1$ and $Ar_2$ are aromatic hydrocarbon groups in the compound represented by formula II.

3. An organic electroluminescent element as described in claim 1 or 2 wherein $Ar_1$ and $Ar_2$ are phenyl groups and $X_1$ is phenylene group in the compound represented by formula II.

4. An organic electroluminescent element as described in claim 1 or 2 wherein the dopant material comprises at least one metal complex selected from phosphorescent ortho-metalated metal complexes and porphyrin metal complexes.

5. An organic electroluminescent element as described in claim 4 wherein the metal complex comprises at least one metal selected from ruthenium, rhodium, palladium, silver, rhenium, osmium, iridium, platinum and gold at its center.

6. An organic electroluminescent element as described in claim 1 or 2 wherein a hole-blocking layer or an electron-transporting layer or both are disposed between the light-emitting layer and the cathode.

* * * * *

UNITED STATES PATENT AND TRADEMARK OFFICE
CERTIFICATE OF CORRECTION

| | | |
|---|---|---|
| PATENT NO. | : 7,582,364 B2 | Page 1 of 1 |
| APPLICATION NO. | : 10/573786 | |
| DATED | : September 1, 2009 | |
| INVENTOR(S) | : Yoshitake et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 473 days.

Signed and Sealed this

Fourteenth Day of September, 2010

David J. Kappos
*Director of the United States Patent and Trademark Office*